(12) United States Patent
Yosui

(10) Patent No.: US 9,887,446 B2
(45) Date of Patent: Feb. 6, 2018

(54) SIGNAL TRANSMISSION CABLE AND COMMUNICATION DEVICE MODULE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 179 days.

(21) Appl. No.: 14/873,283

(22) Filed: Oct. 2, 2015

(65) Prior Publication Data

US 2016/0028358 A1 Jan. 28, 2016

Related U.S. Application Data

(63) Continuation of application No. PCT/JP2014/061360, filed on Apr. 23, 2014.

(30) Foreign Application Priority Data

| May 15, 2013 | (JP) | 2013-103211 |
| May 31, 2013 | (JP) | 2013-115896 |
| Jun. 19, 2013 | (JP) | 2013-128827 |

(51) Int. Cl.
*H01P 1/213* (2006.01)
*H03H 7/01* (2006.01)
(Continued)

(52) U.S. Cl.
CPC ........... *H01P 1/2135* (2013.01); *H01F 17/00* (2013.01); *H01F 27/00* (2013.01); *H01P 1/203* (2013.01);
(Continued)

(58) Field of Classification Search
CPC .......... H03H 2001/0085; H03H 7/0123; H01P 1/203; H01P 7/0123
(Continued)

(56) References Cited

U.S. PATENT DOCUMENTS

| 5,525,953 A | 6/1996 | Okada et al. |
| 2002/0123313 A1 | 9/2002 | Hayakawa et al. |

(Continued)

FOREIGN PATENT DOCUMENTS

| JP | 6-309950 A | 11/1994 |
| JP | 11-162267 A | 6/1999 |

(Continued)

OTHER PUBLICATIONS

Official Communication issued in corresponding Japanese Patent Application No. 2015-193884, dated Aug. 2, 2016.
(Continued)

*Primary Examiner* — Rakesh Patel
(74) *Attorney, Agent, or Firm* — Keating & Bennett, LLP

(57) ABSTRACT

A signal transmission cable including a high-Q value band-elimination filter includes a first signal line conductor pattern including a first capacitor conductor portion and an inductor conductor portion on a first base layer. The first capacitor conductor portion includes a flat conductor, and the inductor conductor portion has a spiral shape. A second signal line conductor pattern including a second capacitor conductor portion is provided on a second base layer. The inductor conductor portion constitutes an inductor, and the first and second capacitor conductor portions and the first base layer constitute a capacitor. The inductor and the capacitor are connected in parallel by transmission conductor portions on the first and second base layers and an interlayer-connector conductor on the first base layer.

20 Claims, 30 Drawing Sheets

(51) Int. Cl.
*H01P 1/203* (2006.01)
*H01F 17/00* (2006.01)
*H01F 27/00* (2006.01)
*H04B 1/38* (2015.01)
*H05K 1/02* (2006.01)
*H05K 1/16* (2006.01)
*H03H 1/00* (2006.01)
*H05K 1/14* (2006.01)
*H05K 1/18* (2006.01)
*H05K 3/46* (2006.01)

(52) U.S. Cl.
CPC ........ *H03H 7/0115* (2013.01); *H03H 7/0123* (2013.01); *H04B 1/38* (2013.01); *H05K 1/0216* (2013.01); *H05K 1/162* (2013.01); *H05K 1/165* (2013.01); *H03H 2001/0085* (2013.01); *H05K 1/0231* (2013.01); *H05K 1/0239* (2013.01); *H05K 1/147* (2013.01); *H05K 1/186* (2013.01); *H05K 3/4635* (2013.01); *H05K 2201/10098* (2013.01); *H05K 2201/10189* (2013.01)

(58) Field of Classification Search
USPC .................................. 333/176, 185, 204, 134
See application file for complete search history.

(56) References Cited

U.S. PATENT DOCUMENTS

| | | |
|---|---|---|
| 2004/0207487 A1 | 10/2004 | Hayashi |
| 2004/0246072 A1 | 12/2004 | Hidaka et al. |
| 2005/0139379 A1 | 6/2005 | Bothe et al. |
| 2007/0085108 A1* | 4/2007 | White .................. H01L 23/552 257/173 |
| 2010/0321130 A1* | 12/2010 | Kim ........................ H03H 7/48 333/126 |
| 2011/0234462 A1 | 9/2011 | Aoki et al. |
| 2013/0127560 A1 | 5/2013 | Kato et al. |

FOREIGN PATENT DOCUMENTS

| | | |
|---|---|---|
| JP | 2000-196391 A | 7/2000 |
| JP | 2002-280862 A | 9/2002 |
| JP | 2002-335101 A | 11/2002 |
| JP | 2003-16133 A | 1/2003 |
| JP | 2003-163503 A | 6/2003 |
| JP | 2004-104528 A | 4/2004 |
| JP | 2005-269590 A | 9/2005 |
| JP | 2009-153106 A | 7/2009 |
| JP | 2010-109747 A | 5/2010 |
| JP | 2010-129386 A | 6/2010 |
| JP | 2011-249206 A | 12/2011 |
| WO | 2005/114778 A1 | 12/2005 |
| WO | 2012/074101 A1 | 6/2012 |

OTHER PUBLICATIONS

Official Communication issued in International Patent Application No. PCT/JP2014/061360, dated Aug. 5, 2014.

* cited by examiner

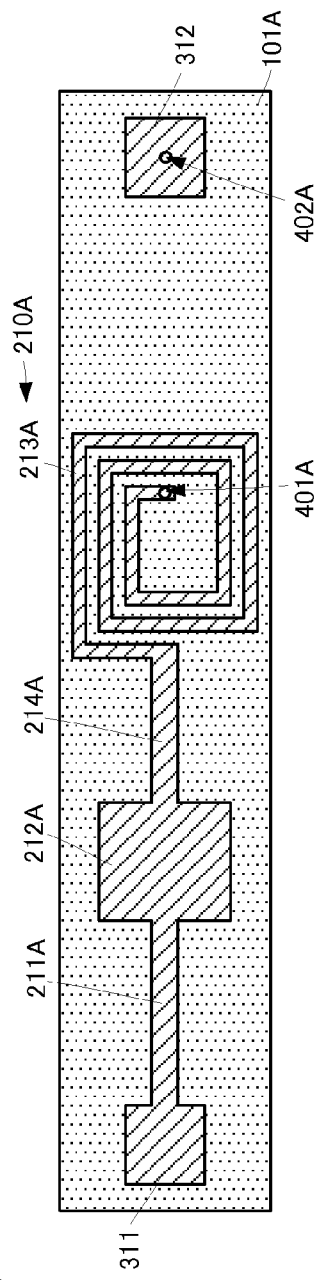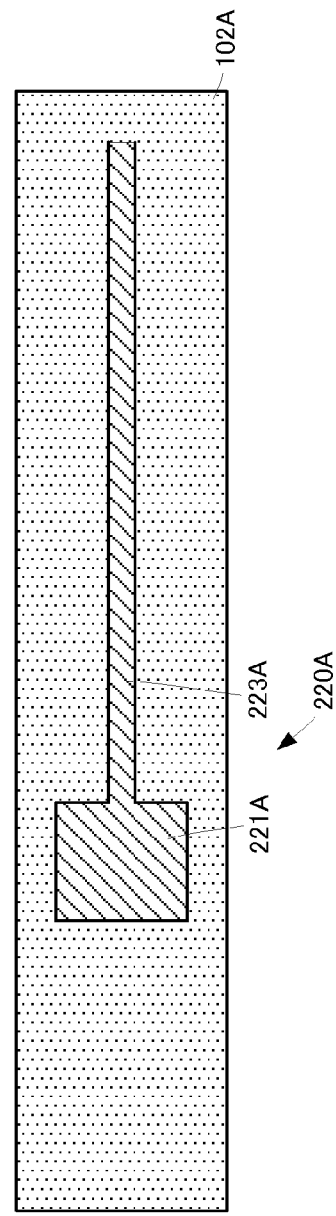

L10:6111,613,6121,6211,623,6221
C10:614(F61),625(F62)
L201:6112,614,6212,624
L202:615,6122,625,6222

SIGNAL TRANSMISSION CABLE AND COMMUNICATION DEVICE MODULE

BACKGROUND OF THE INVENTION

1. Field of the Invention

The present invention relates to signal transmission cables that preferably define and function as a band-elimination filter and/or a signal transmission line connecting two circuits.

2. Description of the Related Art

In the related art, some small electronic devices performing wireless communications such as cellular phones and the like include a plurality of mount-type components such as boards and the like in their casings. In such a case, the plurality of boards is sometimes connected by flexible flat cables.

For example, a small electronic device performing wireless communications includes an antenna board and a front end board (refer to PCT International Publication No. WO 2005/114778 A1). On the antenna board, an antenna is formed for transmitting and receiving high-frequency signals. On the front end board, a front end circuit is formed. The front end circuit generates high-frequency signals to be radiated from the antenna, and amplifies and demodulates high-frequency signals received with the antenna. The antenna board and the front end board are generally placed at locations separated from each other in the casing. Thus, a flat cable is used to connect the antenna board and the front end board.

Further, in current small electronic devices, the antenna is configured to be able to transmit and receive high-frequency signals in a plurality of communication bands, and shared by front end circuits of respective communication bands. Thus, a high-frequency filter is typically connected between the antenna and each front end circuit to establish isolation between the front end circuits of the respective communication bands.

Further, in small electronic devices of the related art, such a high-frequency filter is mounted or formed on the front end board on which the front end circuit is formed. In a case where the high-frequency filter is mounted on the front end board, an inductor and a capacitor constituting the high-frequency filter are mount-type elements, as is the case with an inductor element described in Japanese Unexamined Patent Application Publication No. 2000-196391, for example. In a case where a high-frequency filter is formed on the front end board, an inductor and a capacitor constituting the high-frequency filter are realized with inner layer electrode patterns in the front end board.

However, in the foregoing related art configuration, the high-frequency filter is formed on the front end board. As a result, a shape of the front end board becomes larger by the volume of the high-frequency filter thus formed. This put a limitation on downsizing of the front end board.

Further, when an attempt is made to downsize the high-frequency filter mounted or formed on the front end board, the line width of the inductor is reduced, or constraints are imposed on the shape of the inductor. This degrades the Q value of the inductor, and accordingly degrades the Q value of the high-frequency filter. Accordingly, in some cases, desired filter characteristics (bandpass characteristic or attenuation characteristic) may not be achieved. For example, in a case where a band-elimination filter is formed, a steep attenuation characteristic cannot be achieved.

SUMMARY OF THE INVENTION

Preferred embodiments of the present invention provide a signal transmission cable including a high-Q value band-elimination filter.

A signal transmission cable according to a preferred embodiment of the present invention includes a signal transmission line, a base body, and a band-elimination filter. The signal transmission line connects a first external connection terminal and a second external connection terminal. The base body is a flexible flat member in which the signal transmission line is defined by a conductor pattern. The band-elimination filter is connected between the first external connection terminal and the second external connection terminal by the signal transmission line, and includes an inductor and a capacitor provided in or on the flexible flat base body.

In this configuration, the band-elimination filter is provided within the signal transmission cable. Thus, a high-frequency signal inputted from the first external connection terminal is outputted to the second external connection terminal after a specific frequency band is attenuated by the band-elimination filter. This eliminates the need of a band-elimination filter in two external circuit boards to be connected by the signal transmission cable. Further, compared with mount-type components, a larger area is available to provide an inductor, and flexibility in inductor designing is improved. Thus, a high-Q value inductor is able to be fabricated easily compared with mount-type components. This facilitates realization of a signal transmission cable including a high-Q value band-elimination filter.

Further, preferably, the signal transmission cable according to a preferred embodiment of the present invention has a following configuration. The base body includes a multilayer structure including a stack of a plurality of base layers. The inductor includes a line conductor pattern located on at least one layer of the plurality of base layers. The inductor and the capacitor are connected in parallel by the conductor pattern.

This configuration defines specific configuration examples of the inductor and the band-elimination filter including that inductor. Providing a planar inductor on the base body makes it possible to significantly reduce or prevent an increase in the thickness of the base body due to the formation of the inductor.

Further, preferably, in the signal transmission cable according to a preferred embodiment of the present invention, the capacitor includes flat conductor patterns provided on the plurality of base layers, the flat conductor patterns opposing each other in a stacking direction of the multilayer structure.

In this configuration, the capacitor is also provided inside the base body. Thus, the thickness of the signal transmission cable is significantly reduced.

Further, in the signal transmission cable according to a preferred embodiment of the present invention, the capacitor may be a surface mount element, and this surface mount element may be mounted at a location where the signal transmission line is cut in such a way that the surface mount element is connected in series between separated signal transmission lines.

This configuration makes it possible to have a large capacitance that cannot be achieved with a capacitor composed of flat conductor patterns formed inside the base body.

Further, preferably, the signal transmission cable according to a preferred embodiment of the present invention further includes a series resonance inductor that includes a line conductor pattern provided on the plurality of base layers and is connected in series to the capacitor.

This configuration makes it possible to attenuate a specific frequency band while reducing transmission loss at a second specific frequency band that is different from the specific frequency band.

Further, the signal transmission cable with band-elimination filter functionality according to a preferred embodiment of the present invention may have a following configuration. In each base layer, a first line conductor pattern constituting the inductor and a second line conductor pattern constituting the series resonance inductor are provided. The first line conductor patterns provided at the respective layers are connected by an interlayer-connector conductor, and the second line conductor patterns provided at the respective layers are connected by an interlayer-connector conductor that is different from the first line conductor patterns.

The second line conductor pattern is divided into a first portion connecting to the first external connection terminal and a second portion connecting to the second external connection terminal, and the first portion of the second line conductor pattern provided on a first base layer and the second portion of the second line conductor pattern provided on a second base layer are arranged opposite to each other over the base layer.

This configuration enables the formation of the inductor and the series resonance inductor using substantially the whole section of the base body and reduction of the direct-current resistances of the inductor and the series resonance inductor. Further, this configuration enables the formation of the capacitor using the conductor patterns that constitute the series resonance inductor. This makes it possible to downsize a band-elimination filter including an LC parallel resonance circuit and the series resonance inductor to which a capacitor of the LC parallel resonance circuit is connected in series.

Further, the signal transmission cable with band-elimination filter functionality according to a preferred embodiment of the present invention may have a following configuration. The first line conductor pattern and the second line conductor pattern are provided on three base layers or more, and a plurality of opposing portions of the first portion and the second portion are provided.

This configuration achieves further reduction of the direct-current resistances of the inductor and the series resonance inductor, and widening of an achievable capacitance range of the capacitor.

Further, the signal transmission cable with band-elimination filter functionality according to a preferred embodiment of the present invention may have a following configuration. The inductor includes a first spiral conductor pattern including line conductor patterns and an interlayer-connector conductor connecting the line conductor patterns, each line conductor pattern being provided on a respective layer of a plurality of the base layers and having a loop-shaped portion of which is cut off. The series resonance inductor includes a second spiral conductor pattern including line conductor patterns and an interlayer-connector conductor connecting the line conductor patterns, each line conductor pattern being provided on a respective layer of a plurality of the base layers that is different from the plurality of base layers at which the inductor is provided and including a loop-shaped portion of which is cut off.

In this configuration, the inductor and the series resonance inductor are defined by the spiral conductor patterns. This makes it possible to realize an inductor and a series resonance inductor having higher Q values compared with other inductor and series resonance inductor having different shapes.

Further, in the signal transmission cable with band-elimination filter functionality according to a preferred embodiment of the present invention, a winding direction of the first spiral conductor pattern may be opposite to a winding direction of the second spiral conductor pattern.

Further, preferably, in the signal transmission cable according to a preferred embodiment of the present invention, the flexible flat base body includes liquid crystal polymer. In this configuration, a material having a low tan δ is used for the base body. Thus, the transmission loss of signal transmission line is significantly reduced. Further, the parasitic capacitance of the inductor becomes smaller, and a band-elimination filter having a still higher Q value is provided.

Further, preferably, in the signal transmission cable according to a preferred embodiment of the present invention, the flexible flat base body includes a bent portion between a position of the first external connection terminal and a position of the second external connection terminal. This configuration makes it possible to improve flexibility in arranging a first external circuit board to be connected with the first external connection terminal and a second external circuit board to be connected with the second external connection terminal.

Further, in the signal transmission cable according to a preferred embodiment of the present invention, the first external connection terminal and the second external connection terminal may each include a connector member that establishes an electrical connection with an external circuit by connecting each other mechanically. This configuration defines specific structures of the first and second external connection terminals. This configuration facilitates connecting and fixing of the first and second external connection terminals to the external circuit boards.

A signal transmission cable with diplexer functionality according to a preferred embodiment of the present invention includes the signal transmission cable with band-elimination filter functionality according to one of the preferred embodiments of the present invention described above and a bandpass filter including other conductor patterns provided in the flexible flat base body.

This configuration enables the formation of a thin diplexer having excellent transmission characteristics.

Further, a communication device module according to a preferred embodiment of the present invention includes one of the signal transmission cables, an antenna board connected to the first external connection terminal, and a front end board connected to the second external connection terminal. Further, a communication module according to a preferred embodiment of the present invention includes the signal transmission cable with diplexer functionality, and an antenna board and a front end board that are connected by this signal transmission cable with diplexer functionality.

With these configurations, small communication device modules having excellent communication characteristics are realized by including the signal transmission cable.

According to preferred embodiments of the present invention, the signal transmission cables including high-Q value band-elimination filters are realized. This makes it possible to significantly downsize communication device modules without degrading transmission and reception characteristics.

The above and other elements, features, steps, characteristics and advantages of the present invention will become

BRIEF DESCRIPTION OF THE DRAWINGS

FIG. 7A and FIG. 7B are plan views of conductor patterns in respective base layers of a signal transmission cable according to the second preferred embodiment of the present invention.

DETAILED DESCRIPTION OF THE PREFERRED EMBODIMENTS

Figure 1:
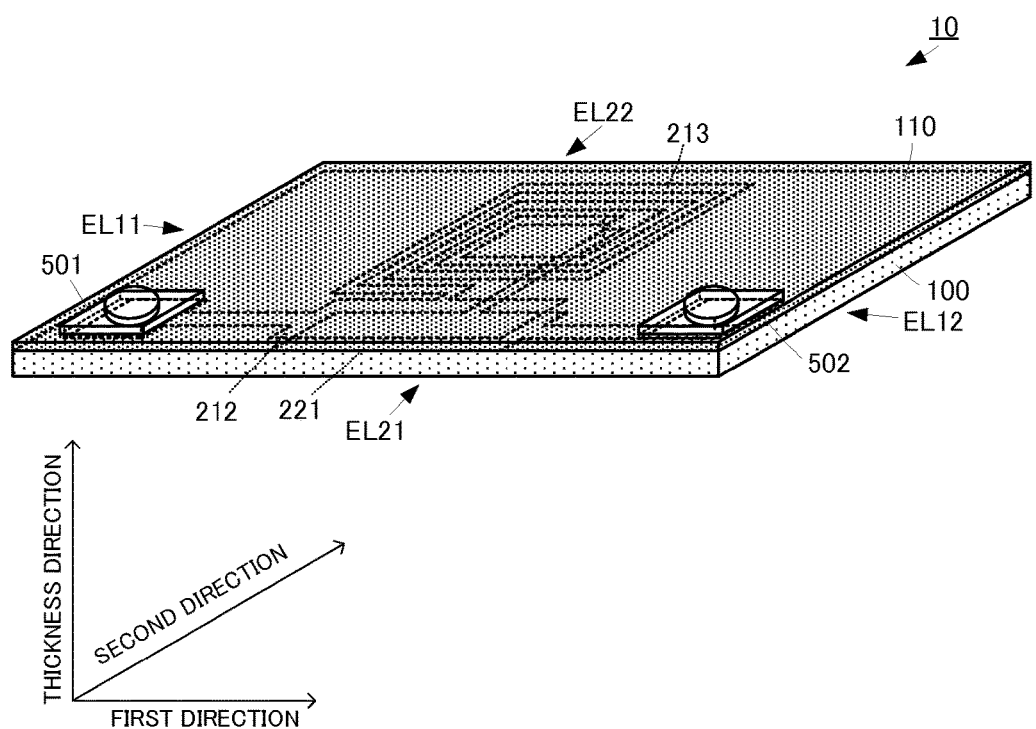
FIG. 1 is an external perspective view of a signal transmission cable according to a first preferred embodiment of the present invention.
Figure 2:
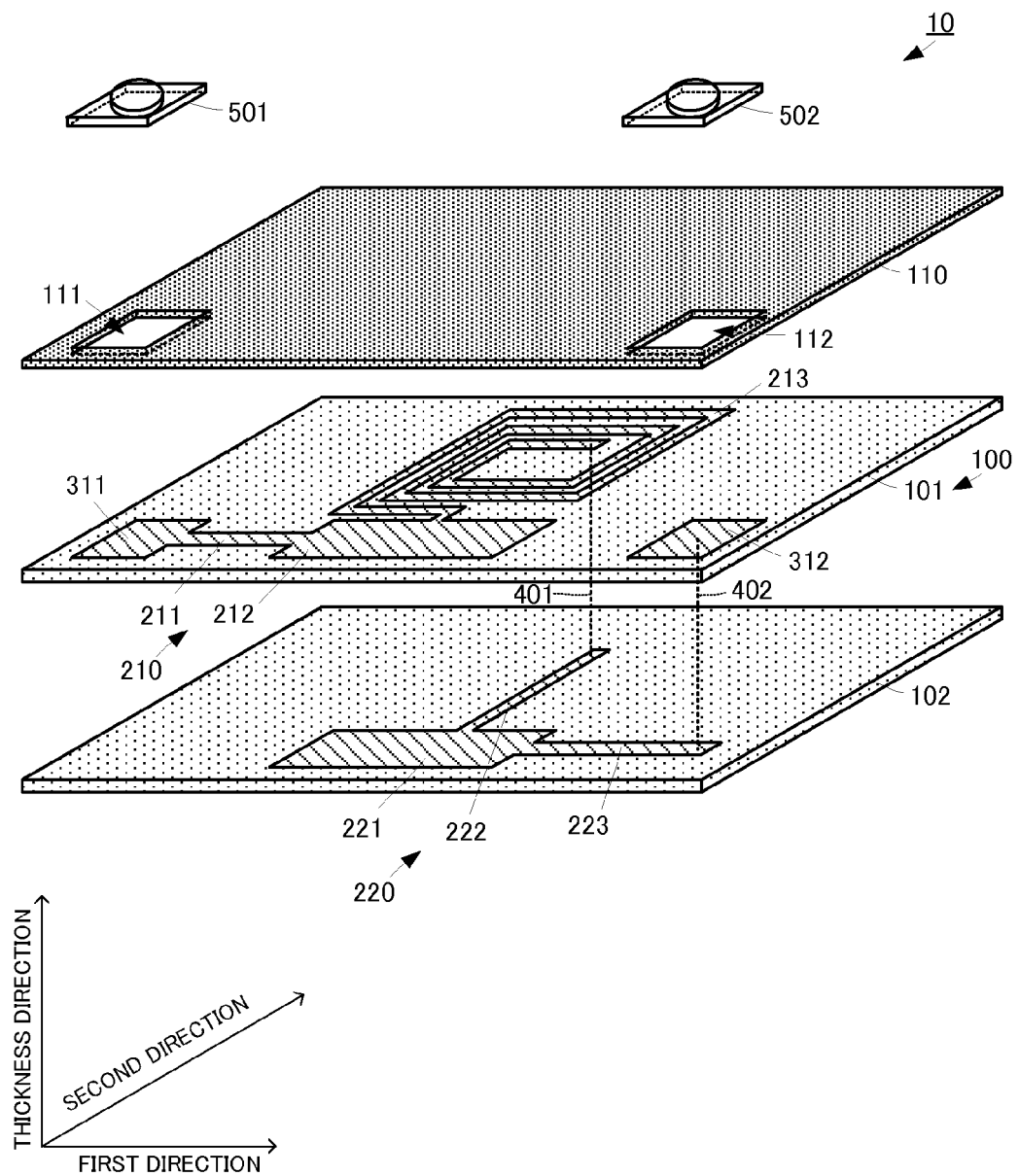
FIG. 2 is an exploded perspective view of a signal transmission cable according to the first preferred embodiment of the present invention.
Figure 3A:
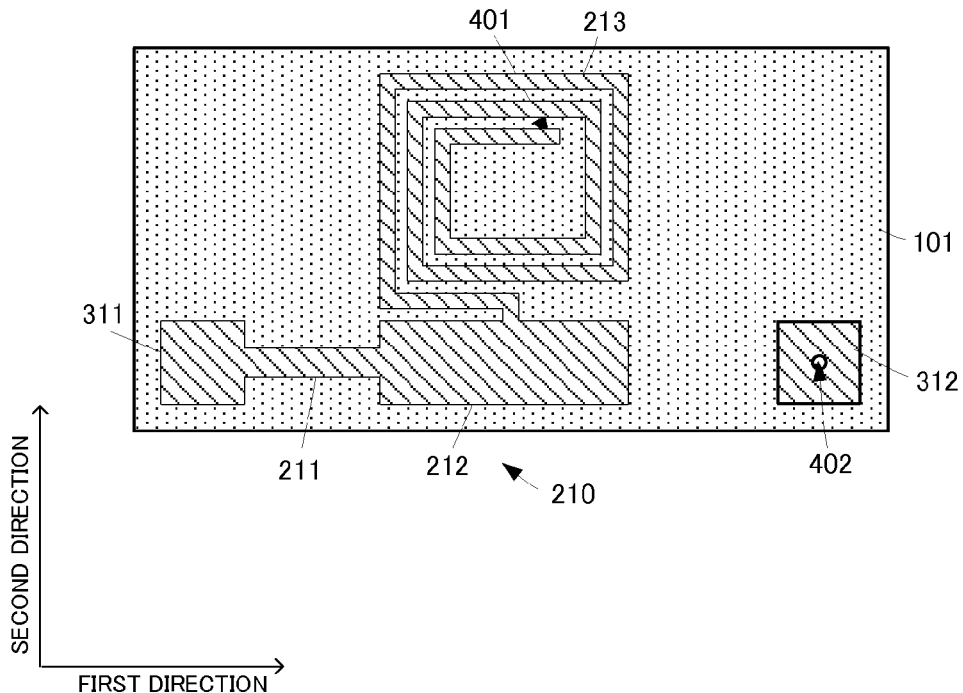
FIG. 3A and FIG. 3B are plan views of conductor patterns in respective base layers of a signal transmission cable according to the first preferred embodiment of the present invention.
Figure 3B:
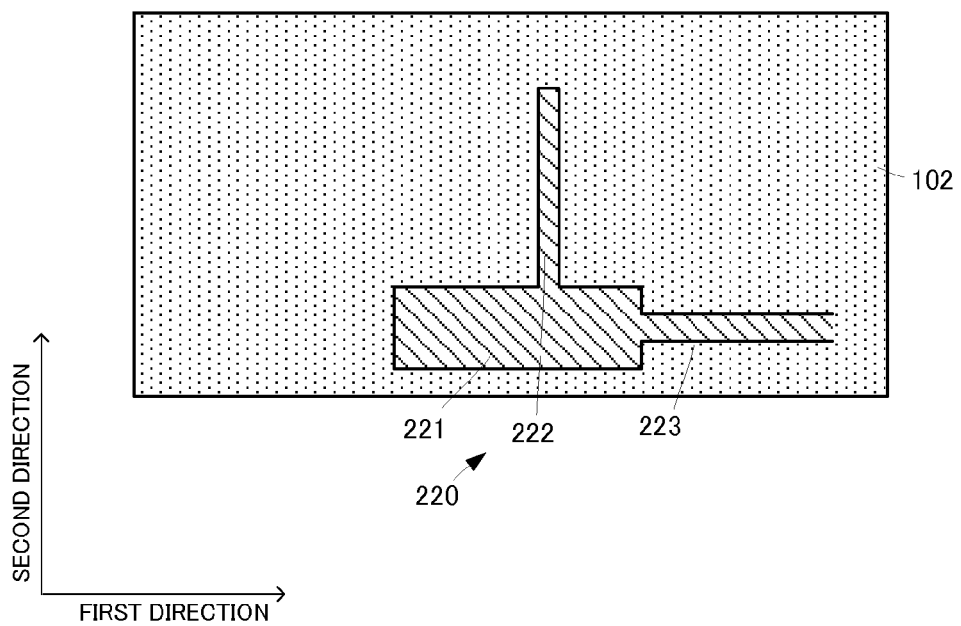

A signal transmission cable according to a first preferred embodiment of the present invention is described with reference to the drawings. FIG. 1 is an external perspective view of a signal transmission cable according to the first preferred embodiment of the present invention. FIG. 2 is an exploded perspective view of the signal transmission cable according to the first preferred embodiment of the present invention. FIG. 3A and FIG. 3B are plan views of conductor patterns in respective base layers of the signal transmission cable according to the first preferred embodiment of the present invention. In the following section, to view the signal transmission cable (base body and base layers) in a direction orthogonal to a first direction and a second direction is referred to as "to view in planar view".

As depicted in FIG. 1, a signal transmission cable 10 includes a flat base body 100 extending in two directions, the first direction and the second direction. The length of the base body 100 in the first direction is determined based on a distance between connecting locations of two external circuit boards to be connected by this signal transmission cable 10. The length of the base body 100 in the second direction is determined based on shapes of inductors or capacitors provided inside the base body 100, which will be described below. The thickness of the base body 100 may be arbitrarily determined, and is about 0.2 mm to 0.5 mm, for example. An insulating resist film 110 is provided on one of flat surfaces (surfaces parallel to the first direction and the second direction) of the base body 100 so as to cover substantially the entire area thereof.

The base body 100 is formed preferably by stacking a base layer 101 and a base layer 102. The base layers 101 and 102 are each composed of a flexible insulating flat film such as, for example, a liquid crystal polymer. The base layers 101 and 102 are stacked in this order from the resist film 110 side. In other words, the resist film 110 is provided on a flat surface of the base layer 101 opposite to the base layer 102.

A signal line conductor pattern 210 and external connection conductors 311 and 312 are provided on the resist film 110 side surface of the base layer 101. The signal line conductor pattern 210 and the external connection conductors 311 and 312 are composed of a metal having high electrical conductivity and the like, such as a copper foil and the like.

The external connection conductor 311 is located in the vicinity of an EL11 end portion that is one end portion of the base layer 101 in the first direction. The external connection conductor 311 is square or approximately square in planar view. The external connection conductor 312 is located in the vicinity of an EL12 end portion that is the other end portion of the base layer 101 in the first direction. The external connection conductor 312 is square or approximately square in planar view.

As depicted in FIG. 2 and FIG. 3A, the signal line conductor pattern 210 includes a transmission conductor portion 211, a capacitor conductor portion 212, and an inductor conductor portion 213.

The transmission conductor portion 211 is a line conductor extending in the first direction. One end portion of the transmission conductor portion 211 in the extending direction is connected to the external connection conductor 311. The other end portion of the transmission conductor portion 211 in the extending direction is connected to the capacitor conductor portion 212.

The capacitor conductor portion 212 is a flat conductor, and the length of the capacitor conductor portion 212 in the second direction is longer than the length of the transmission conductor portion 211 in the second direction. In other words, the capacitor conductor portion 212 includes a wide-width flat conductor.

The inductor conductor portion 213 includes a line conductor having a spiral shape in planar view. The inductor conductor portion 213 is provided at substantially the same location as the capacitor conductor portion 212 in the first direction. An outer circumferential side end portion of the spiral shape of the inductor conductor portion 213 is connected to the capacitor conductor portion 212. For example, the outer circumferential side end portion of the inductor conductor portion 213 is connected to substantially the center position of the capacitor conductor portion 212 in the first direction. A center-side end portion of the inductor conductor portion 213 is connected to an interlayer-connector conductor 401.

The base layer 101 includes the interlayer-connector conductors 401 and 402. The interlayer-connector conductor 401 and 402 are formed preferably by filling through-holes that penetrates the base layer 101 with electrically conductive paste and solidifying them. The electrically conductive paste includes an electrically conductive material whose primary component is silver or tin.

The interlayer-connector conductor 401 is provided at the location of the center-side end portion of the inductor conductor portion 213. The interlayer-connector conductor 402 is provided inside a formation region of the external connection conductor 312.

A signal line conductor pattern 220 is provided on the base layer 101 side surface of the base layer 102. As is the case with the signal line conductor pattern 210, the signal line conductor pattern 220 includes a metal having high electrical conductivity and the like, such as a copper foil and the like.

As depicted in FIG. 2 and FIG. 3B, the signal line conductor pattern 220 includes a capacitor conductor portion 221 and transmission conductor portions 222 and 223.

As is the case with the capacitor conductor portion 212 of the base layer 101, the capacitor conductor portion 221 includes a wide-width flat conductor. The capacitor conductor portion 221 faces the capacitor conductor portion 212 over the base layer 101.

The transmission conductor portion 222 is a line conductor extending in the second direction. One end portion of the transmission conductor portion 222 in the extending direction (end portion on EL21 side) is connected to the capacitor conductor portion 221. The other end portion of the transmission conductor portion 222 in the extending direction (end portion on EL22 side) is connected to the interlayer-connector conductor 401.

The transmission conductor portion 223 is a line conductor extending in the first direction, and one end portion of the transmission conductor portion 223 in the extending direction (end portion on EL11 side) is connected to the capacitor conductor portion 221. The other end portion of the transmission conductor portion 223 in the extending direction (end portion on EL12 side) is connected to the interlayer-connector conductor 402.

Connectors 501 and 502 are provided on the resist film 110 side of the base body 100. The connectors 501 and 502 each has a structure that establishes electrical connection between a circuit of an external board and the signal transmission cable 10 by physically connecting the connector to a connector mount portion of an external circuit board, which is not illustrated in the drawings. The connectors 501 and 502 may be omitted. However, the use of the connectors 501 and 502 makes it possible to improve reliability of connections between the signal transmission cable 10 and first and second external circuit boards.

The connector 501 is disposed at an opening 111 provided on the resist film 110 and mounted on the external connection conductor 311. A combination of these elements corresponds to a first external connection terminal. The connector 502 is arranged at an opening 112 in the resist film 110 and mounted on the external connection conductor 312. A combination of these elements corresponds to a second external connection terminal.

According to the foregoing configuration, a high-frequency signal inputted from a first external circuit board via the connector 501 is transmitted through the external connection conductor 311, the signal line conductor pattern 210, the signal line conductor pattern 220, and the external connection conductor 312, and outputted to a second external circuit board via the connector 502. More precisely speaking, the high-frequency signals travel the interlayer-connector conductors 401 and 402. These elements are included in the signal line conductor patterns that constitute a signal transmission line.

Figure 4:
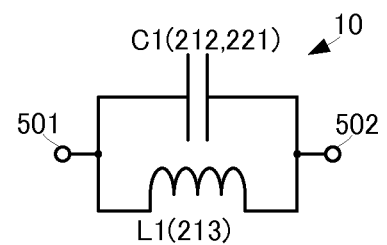
FIG. 4 is an equivalent circuit diagram of a signal transmission cable according to the first preferred embodiment of the present invention.

Further, using the configuration of the present preferred embodiment makes it possible to realize a band-elimination filter circuit whose equivalent circuit is depicted in FIG. 4. FIG. 4 is an equivalent circuit diagram of a signal transmission cable according to the first preferred embodiment of the present invention.

As depicted in FIG. 4, the signal transmission cable of the present preferred embodiment has a circuit configuration in which a parallel circuit of an inductor L1 and a capacitor C1 is connected between the external connection conductors 501 and 502. The inductor L1 is realized with the inductor conductor portion 213 having the spiral shape. The capacitor C1 is realized with the capacitor conductors 212 and 221 opposing each other and the base layer 101 sandwiched between the capacitor conductors 212 and 221. Lines connecting in parallel the inductor L1 and the capacitor C1 are realized with the transmission conductor portion 222 and a connecting portion between the inductor conductor portion 213 and the capacitor conductor 212.

As described above, by using the configuration of the present preferred embodiment, the signal transmission cable 10 including an LC parallel resonance circuit is realized. Further, this LC parallel resonance circuit works as a band-elimination filter whose attenuation pole frequency is set at a desired frequency by adjusting values of elements. In other words, by using the configuration of the present preferred embodiment, a signal transmission cable with band-elimination filter functionality is realized.

This makes it possible to provide a small communication device module including the signal transmission cable 10 without requiring any additional mounting of an inductor or a capacitor on an external circuit board.

Further, in the configuration of the present preferred embodiment, the inductor is preferably provided on the flat surface of the base body 100 based on the length of the base body 100 in the second direction. Accordingly, the conductors that constitute the inductor are able to be made wider in width and larger in size compared with a mount-component type inductor mounted on a related art external circuit board. This reduces the series resistance of the inductor and improves the Q value. Accordingly, a high-Q value LC parallel resonance circuit, namely, a band-elimination filter with steep attenuation characteristic is realized.

Figure 5:
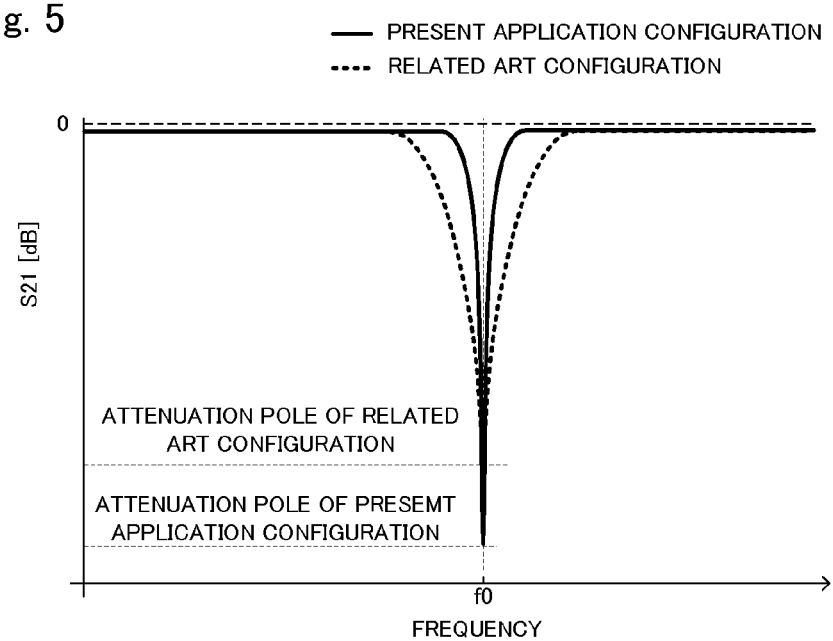
FIG. 5 is a graph depicting bandpass characteristic of a signal transmission cable according to the first preferred embodiment of the present invention and bandpass characteristic of a combined structure of a signal transmission cable of related art and a band-elimination filter element.

FIG. 5 is a graph depicting the bandpass characteristic of a signal transmission cable according to the first preferred embodiment of the present invention and the bandpass characteristic of a combined structure of a signal transmission cable of related art and a band-elimination filter element. As depicted in FIG. 5, compared with a combination of a signal transmission cable and a mount type band-elimination filter element of related art, the signal transmission cable 10 of the present preferred embodiment has a steeper attenuation characteristic and achieves a larger level of attenuation than related art at attenuation pole frequency f0.

In the present preferred embodiment, an example is described in which a liquid crystal polymer is used for the base layers 101 and 102. However, a different material may alternatively be used as long as the material is a flexible insulating material. It should be noted that, when a liquid crystal polymer is used, tan δ becomes small, and this reduces the transmission loss of signal transmission line. Further, this reduces the parasitic capacitance of inductor becomes smaller, thus realizing a band-elimination filter having a still higher Q value.

The signal transmission cable 10 is fabricated in the following manner. First, the base layers 101 and 102 including copper cladding on one side are prepared. The signal line conductor pattern 210 and the external connection conductors 311 and 312 are formed preferably by performing a patterning process on the copper foil of the base layer 101.

Similarly, the signal line conductor pattern 220 is formed preferably by performing a patterning process on the copper foil of the base layer 102.

Next, through-holes are formed on the base layer 101. These through-holes are formed from the opposite side of the formation surface of the signal line conductor pattern 210 and the external connection conductor 312 using, for example, a laser and the like. Further, these through-holes are filled with an electrically conductive paste.

Subsequently, the base layers 101 and 102 are stacked on top of each other, and the base layers 101 and 102 thus stacked are then subjected to thermocompression bonding. During this process, the electrically conductive paste inside the through-holes is solidified, and the interlayer-connector conductors 401 and 402 are formed.

Subsequently, the resist film 110 is formed on the base layer 101 side surface of the base body 100. The openings 111 and 112 are in the resist film 110 at regions that contact the external connection conductors 311 and 312. The connector 501 and 502 are mounted by fitting in the openings 111 and 112 to connect to the external connection conductors 311 and 312, respectively.

Figure 6:
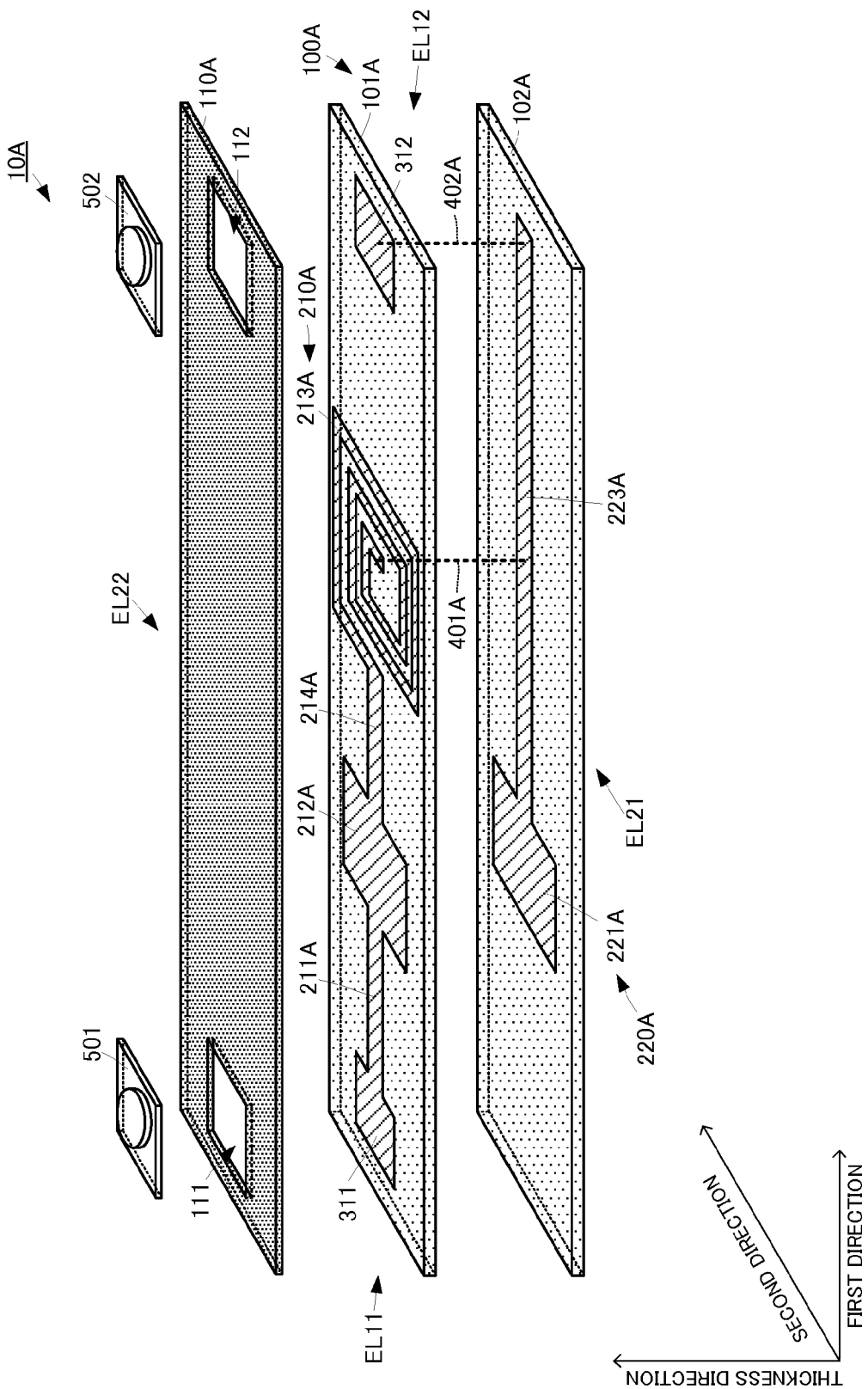
FIG. 6 is an exploded perspective view of a signal transmission cable according to a second preferred embodiment of the present invention.

Next, a signal transmission cable according to the second preferred embodiment of the present invention is described with reference to the drawings. FIG. 6 is an exploded perspective view of the signal transmission cable according to the second preferred embodiment of the present invention. FIGS. 7A and 7B are plan views of conductor patterns in respective base layers of the signal transmission cable according to the second preferred embodiment of the present invention. A signal transmission cable 10A of the present preferred embodiment differs from the signal transmission cable 10 according to the first preferred embodiment in that the inductor and the capacitor are arranged along the first direction. The same structures are preferably used to install a resist film 110A and connectors 501 and 502, and the description thereof is omitted.

As depicted in FIG. 6, FIG. 7A, and FIG. 7B, a base body 100A of the signal transmission cable 10A is formed preferably by stacking base layers 101A and 102A and has an elongated shape extending in the first direction.

A signal line conductor pattern 210A and the external connection conductors 311 and 312 are provided on the resist film 110A side surface of the base layer 101A. The external connection conductor 311 is located in the vicinity of the EL11 end portion of the base layer 101A, and the external connection conductor 312 is located in the vicinity of the EL12 end portion of the base layer 101A.

As depicted in FIG. 6 and FIG. 7A, the signal line conductor pattern 210A includes transmission conductor portions 211A and 214A, a capacitor conductor portion 212A, and an inductor conductor portion 213A.

The transmission conductor portion 211A is a line conductor extending in the first direction. One end portion of the transmission conductor portion 211A in the extending direction is connected to the external connection conductor 311. The other end portion of the transmission conductor portion 211A in the extending direction is connected to the capacitor conductor portion 212A.

The capacitor conductor portion 212A is a flat conductor, and the length of the capacitor conductor portion 212A in the second direction is longer than the lengths of the transmission conductor portions 211A and 214A in the second direction. In other words, the capacitor conductor portion 212A includes a wide-width flat conductor.

The inductor conductor portion 213A includes a line conductor having a spiral shape in planar view. The inductor conductor portion 213A is formed between the capacitor conductor portion 212A and the external connection conductor 312 in the first direction so as to be separated therefrom.

An outer circumferential side end portion of the spiral shape of the inductor conductor portion 213A is connected to the capacitor conductor portion 212A via the transmission conductor portion 214A including a line conductor. A center-side end portion of the inductor conductor portion 213A is connected to an interlayer-connector conductor 401A.

The base layer 101A includes interlayer-connector conductors 401A and 402A. The interlayer-connector conductor 401A is provided at the location of the center-side end portion of the inductor conductor portion 213A. The interlayer-connector conductor 402A is provided inside a formation region of the external connection conductor 312.

A signal line conductor pattern 220A is provided on the base layer 101A side surface of the base layer 102A. As depicted in FIG. 6 and FIG. 7B, the signal line conductor pattern 220A includes a capacitor conductor portion 221A and a transmission conductor portion 223A.

As is the case with the capacitor conductor portion 212A of the base layer 101A, the capacitor conductor portion 221A includes a wide-width flat conductor. The capacitor conductor portion 221A opposes the capacitor conductor portion 212A over the base layer 101A.

The transmission conductor portion 223A is a line conductor extending in the first direction, and one end portion of the transmission conductor portion 223A in the extending direction (end portion on EL11 side) is connected to the capacitor conductor portion 221A. The other end portion of the transmission conductor portion 223A in the extending direction (end portion on EL12 side) is connected to the interlayer-connector conductor 402A.

Even in such a configuration, as is the case with the first preferred embodiment, a signal transmission cable including a high-Q value band-elimination filter is realized. Further, in the configuration of the present preferred embodiment, the inductor and the capacitor are arranged along the extending direction of the signal transmission cable. Thus, a narrow-width signal transmission cable is provided.

Figure 8:
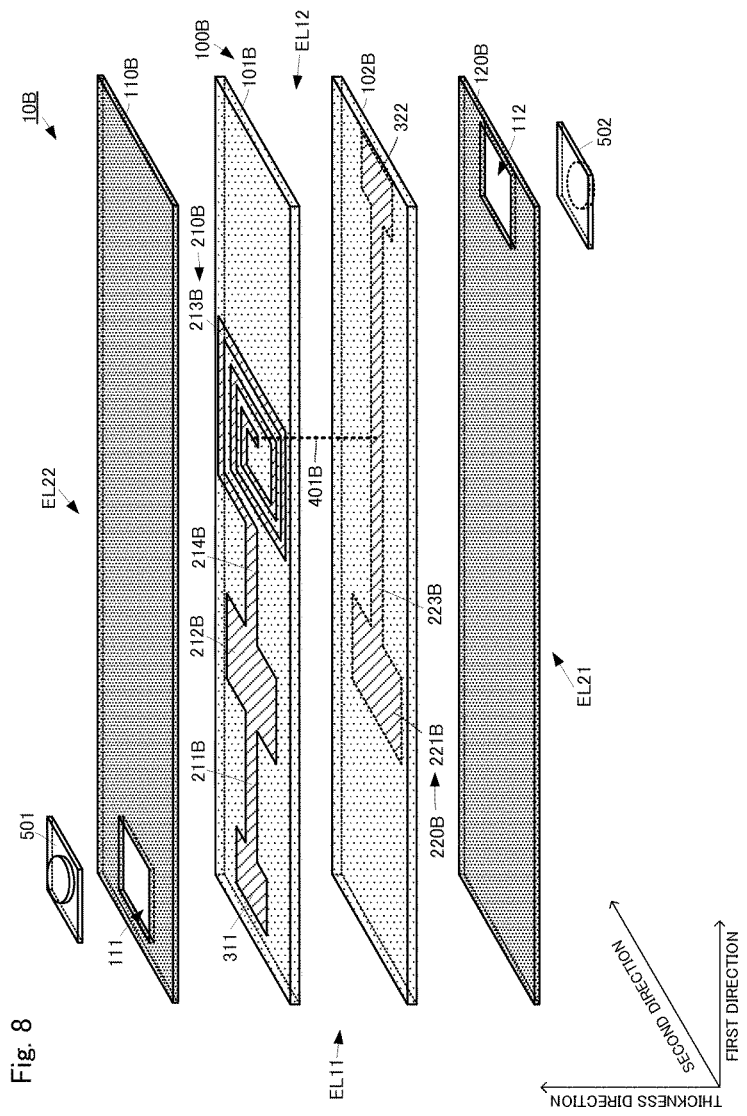
FIG. 8 is an exploded perspective view of a signal transmission cable according to a third preferred embodiment of the present invention.

Next, a signal transmission cable according to the third preferred embodiment is described with reference to the drawings. FIG. 8 is an exploded perspective view of the signal transmission cable according to the third preferred embodiment of the present invention. A signal transmission cable 10B of the present preferred embodiment differs from the signal transmission cable 10A described in the second preferred embodiment in arrangement of the connector 502 on a surface of a base body 100B. In addition to the above, the signal transmission cable 10B of the present preferred embodiment differs from the signal transmission cable 10A described in the second preferred embodiment in formation configuration of a signal line conductor pattern 220B on a base layer 102B. Thus, only portions different from the signal transmission cable 10A described in the second preferred embodiment and relevant sections requiring additional descriptions are described in detail.

The base body 100B includes base layers 101B and 102B. The base layer 101B is the same as the base layer 101A, and a signal line conductor pattern 210B is the same as the signal line conductor pattern 210A. On the base layer 101B, only the external connection conductor 311 is provided.

The signal line conductor pattern 220B and the external connection conductor 322 are provided on the base layer 102B at a surface opposite to the base layer 101B. The external connection conductor 322 is located in the vicinity of the EL12 end portion of the base layer 102B.

As depicted in FIG. 8, the signal line conductor pattern 220B includes a capacitor conductor portion 221B and a transmission conductor portion 223B.

As is the case with the capacitor conductor portion 212B of the base layer 101B, the capacitor conductor portion 221B includes a wide-width flat conductor. The capacitor conductor portion 221B opposes the capacitor conductor portion 212B over the base layers 101B and 102B.

The transmission conductor portion 223B is a line conductor extending in the first direction, and one end portion of the transmission conductor portion 223B in the extending direction (end portion on EL11 side) is connected to the capacitor conductor portion 221B. The other end portion of the transmission conductor portion 223B in the extending direction (end portion on EL12 side) is connected to the external connection conductor 322.

An insulating resist film 120B is provided on a flat surface of the base layer 102B opposite to the base layer 101B so as to cover substantially the entire area thereof. The connector 502 is arranged at the opening 112 in the resist film 120B and mounted on the external connection conductor 322. A combination of these elements corresponds to the second external connection terminal.

Even in such a configuration, as is the cases with the first and second preferred embodiments, a signal transmission cable including a high-Q value band-elimination filter is realized. Further, even in a case where two external circuit boards arranged along the thickness direction are to be connected and their connecting directions are opposite to each other, using the configuration of the present preferred embodiment enables to connect these two external circuit boards easily.

Figure 9:
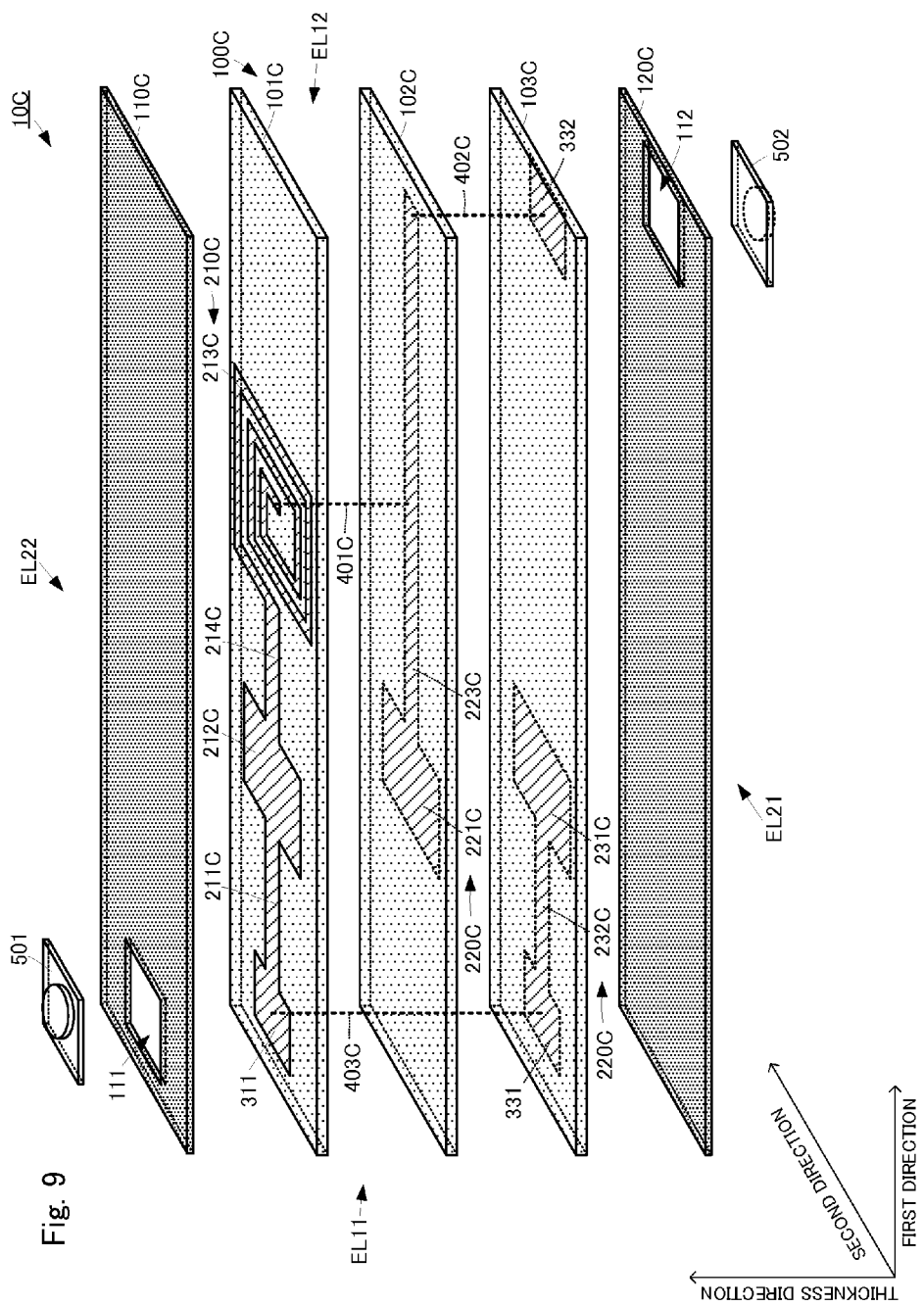
FIG. 9 is an exploded perspective view of a signal transmission cable according to a fourth preferred embodiment of the present invention.

Next, a signal transmission cable according to the fourth preferred embodiment is described with reference to the drawings. FIG. 9 is an exploded perspective view of the signal transmission cable according to the fourth preferred embodiment of the present invention. A signal transmission cable 10C of the present preferred embodiment differs from the signal transmission cable 10B described in the third preferred embodiment in configuration of the capacitor. Thus, only portions different from the signal transmission cable 10B described in the third preferred embodiment and relevant sections requiring additional descriptions are described in detail.

A base body 100C is formed preferably by stacking base layers 101C, 102C, and 103C in this order. On the base layer 102C, only a signal line conductor pattern 220C is formed. The signal line conductor pattern 220C includes a capacitor conductor portion 221C and a transmission conductor portion 223C. The transmission conductor portion 223C is a line conductor extending in the first direction, and one end portion of the transmission conductor portion 223C in the extending direction (end portion on EL11 side) is connected to the capacitor conductor portion 221C. The other end portion of the transmission conductor portion 223C in the extending direction (end portion on EL12 side) is extended close to the EL12 side end portion and connected to an interlayer-connector conductor 402C.

An interlayer-connector conductor 403C is located inside formation regions of the external connection conductor 311 in the base layers 101C and 102C. The interlayer-connector conductor 402C is located close to the EL12 side end portion of the base layer 102C. These interlayer-connector conductors 402C and 403C have shapes that are continuous with the base layer 103C.

A signal line conductor pattern 232C, an external connection auxiliary conductor 331, and the external connection conductor 332 are provided on the base layer 103C at a surface opposite to the base layer 102C.

The external connection auxiliary conductor 331 is located in the vicinity of the EL11 end portion of the base layer 102C. The external connection auxiliary conductor 331 is connected to the interlayer-connector conductor 403C. The external connection conductor 332 is located in the vicinity of the EL12 end portion of the base layer 102C. The external connection conductor 332 is connected to the interlayer-connector conductor 402C.

The signal line conductor pattern 230C includes a capacitor conductor portion 231C and a transmission conductor portion 232C.

As is the case with the capacitor conductor portion 212C of the base layer 101C and the capacitor conductor portion 221C of the base layer 102C, the capacitor conductor portion 231C includes a wide-width flat conductor. The capacitor conductor portion 231C opposes the capacitor conductor portion 221C over the base layer 103C.

The transmission conductor portion 232C is a line conductor extending in the first direction, and one end portion of the transmission conductor portion 232C in the extending direction (end portion on EL11 side) is connected to the external connection auxiliary conductor 331. The other end portion of the transmission conductor portion 232C in the extending direction (end portion on EL12 side) is connected to the capacitor conductor portion 231C.

An insulating resist film 120C is provided on a flat surface of the base layer 103C opposite to the base layer 102C so as to cover substantially the entire area thereof. The connector 502 is arranged at the opening 112 in the resist film 120C and mounted on the external connection conductor 332. A combination of these elements corresponds to the second external connection terminal.

In this configuration, the capacitor conductor portions 212C and 221C are arranged opposite to each other over the base layers 101C and 102C, and the capacitor conductor portions 221C and 231C are arranged opposite to each other over the base layer 103C. Even with such a configuration, a capacitor is able to be provided, and a larger capacitance is able to be obtained with the same opposing area as in the foregoing preferred embodiments.

Even with such a configuration, functions and effects similar to those of the third preferred embodiment are obtained. Further, using the configuration of the present preferred embodiment makes it possible to obtain a larger capacitance and a wider range of frequencies of an attenuation pole.

Figure 10:
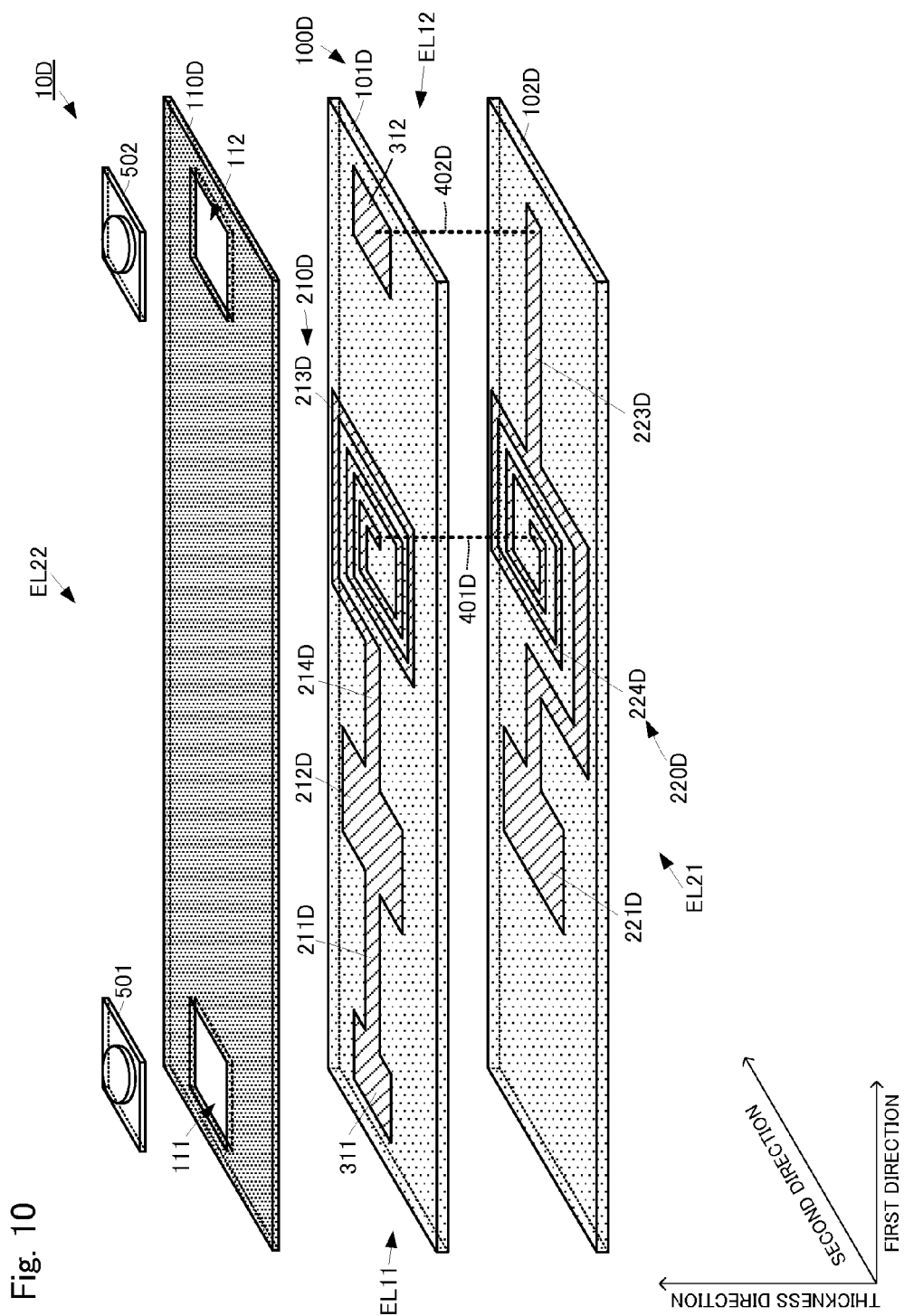
FIG. 10 is an exploded perspective view of a signal transmission cable according to a fifth preferred embodiment of the present invention.

Next, a signal transmission cable according to the fifth preferred embodiment of the present invention is described with reference to the drawings. FIG. 10 is an exploded perspective view of the signal transmission cable according to the fifth preferred embodiment of the present invention. A signal transmission cable 10D of the present preferred embodiment differs from the signal transmission cable 10A described in the second preferred embodiment in that the inductor includes two layers. Thus, only portions different from the signal transmission cable 10A described in the second preferred embodiment and relevant sections requiring additional descriptions are described in detail.

A base body 100D includes base layers 101D and 102D. On the base layer 102D, a signal line conductor pattern 220D is provided. The signal line conductor pattern 220D includes a capacitor conductor portion 221D, a transmission conductor portion 223D, and an inductor conductor portion 224D.

The inductor conductor portion 224D is provided on the base layer 102D closer to an EL12 end portion side than the capacitor conductor portion 221D in the first direction. The inductor conductor portion 224D is disposed at the same or substantially the same location as a formation location of an inductor conductor portion 213D on the base layer 101D. As is the case with the inductor conductor portion 213D, the inductor conductor portion 224D has a spiral shape. A center-side end portion of the inductor conductor portion 224D is connected to a center-side end portion of the inductor conductor portion 213D via an interlayer-connector conductor 401D. The inductor conductor portion 224D continuously winds in the same direction from the inductor conductor portion 213D.

The transmission conductor portion 223D is a line conductor that connects the capacitor conductor portion 221D and an interlayer-connector conductor 402D disposed near the EL12 end portion. The transmission conductor portion 223D has a shape that goes around a formation region of the inductor conductor portion 224D. The transmission conductor portion 223D is connected to an outer circumferential side end portion of the inductor conductor portion 224D.

In this configuration, an inductor of an LC parallel resonance circuit includes the inductor conductor portions 213D and 224D, which are provided on the two layers, and the interlayer-connector conductor 401D connecting these inductor conductor portions 213D and 224D. Accordingly, an inductor having a still larger inductance is provided.

Even with such a configuration, functions and effects similar to those of the second preferred embodiment are obtained. Further, using the configuration of the present preferred embodiment makes it possible to obtain a larger inductance and widen a range of frequencies of an attenuation pole.

Figure 11:
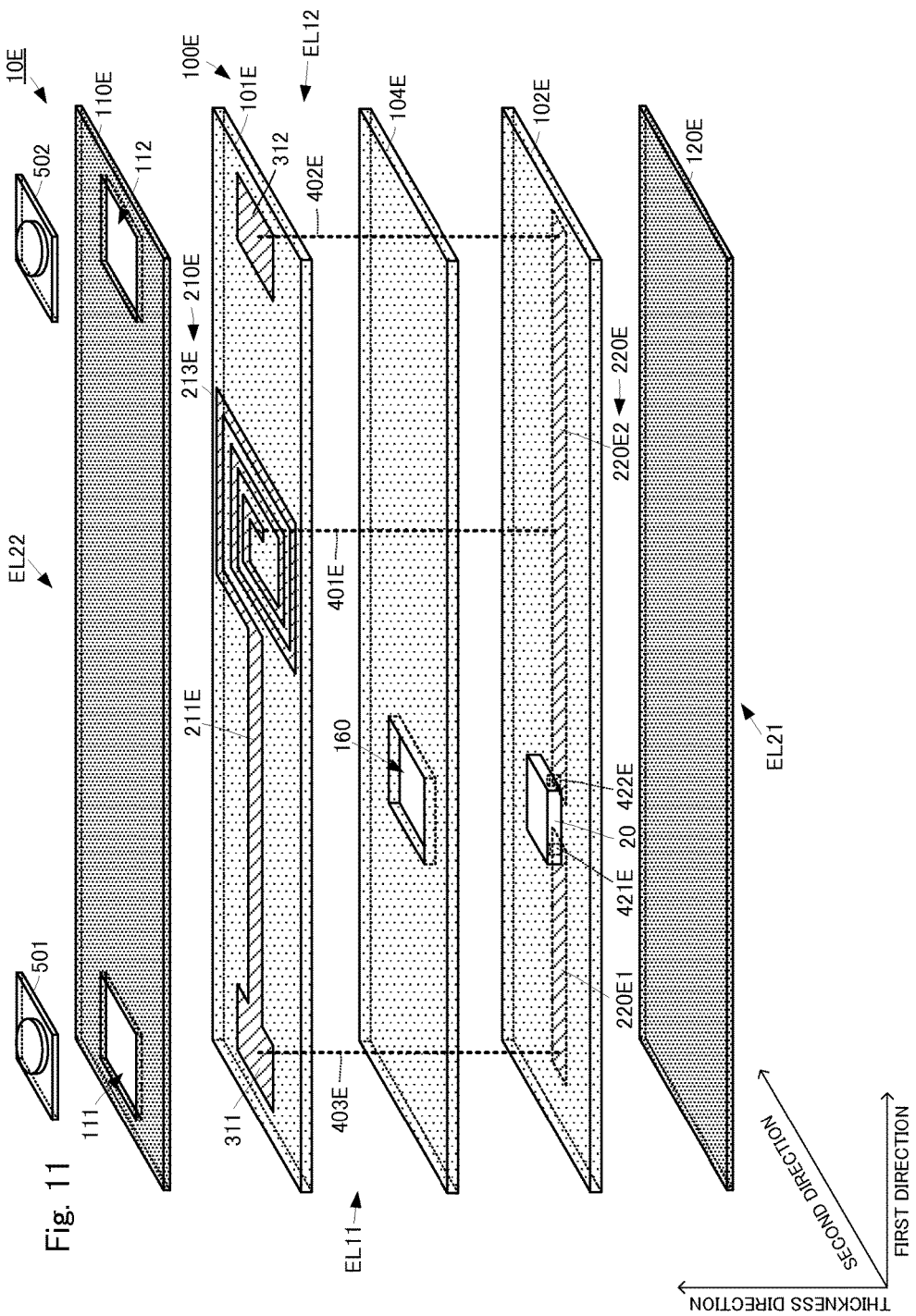
FIG. 11 is an exploded perspective view of a signal transmission cable according to a sixth preferred embodiment of the present invention.

Next, a signal transmission cable according to the sixth preferred embodiment of the present invention is described with reference to the drawings. FIG. 11 is an exploded perspective view of the signal transmission cable according to the sixth preferred embodiment of the present invention. A signal transmission cable 10E of the present preferred embodiment differs from the signal transmission cable 10A described in the second preferred embodiment in that the capacitor is a surface mount element and this surface mount capacitor is built into a base body 100E. Thus, only portions different from the signal transmission cable 10A described in the second preferred embodiment and relevant sections requiring additional descriptions are described in detail.

The base body 100E is formed preferably by stacking base layers 101E, 104E, and 102E in this order. No capacitor conductor portion is provided on the base layer 101E.

A signal line conductor pattern 220E is provided on the base layer 102E at a surface opposite to the base layer 104E. Along with this, a resist film 120E is provided on a surface of the base layer 102E opposite to the base layer 104E so as to cover the entire area thereof. The signal line conductor pattern 220E is a line conductor extending in the first direction and separated in the middle. An individual portion of the signal line conductor pattern 220E on the EL11 end portion side is a signal line conductor pattern 220E1, and an individual portion of the signal line conductor pattern 220E on the EL12 end portion side is a signal line conductor pattern 220E2. The signal line conductor pattern 220E2 is connected to a center-side end portion of an inductor conductor portion 213E via an interlayer-connector conductor 401E.

An end portion of the signal line conductor pattern 220E1 on the EL11 end portion side is connected to the external connection conductor 311 via an interlayer-connector conductor 403E. An end portion of the signal line conductor pattern 220E1 on the EL12 end portion side is connected to an interlayer-connector conductor 421E having a shape that penetrates through the base layer 102E in the thickness direction. An end portion of the signal line conductor pattern 220E2 on the EL12 end portion side is connected to the external connection conductor 312 via an interlayer-connector conductor 402E. An end portion of the signal line conductor pattern 220E2 on the EL11 end portion side is connected to an interlayer-connector conductor 422E having a shape that penetrates through the base layer 102E in the thickness direction.

A surface mount capacitor element 20 is disposed on the base layer 104E side surface of the base layer 102E. The capacitor element 20 is mounted in such a way that its external connection terminals at both ends are connected to the interlayer-connector conductors 421E and 422E.

The base layer 104E has no conductor pattern, and a through-hole 160 is provided on this base layer 104E. The through-hole 160 is formed so as to include a mounting region of the capacitor element 20 in planar view of the base body 100E.

Even with such a configuration, functions and effects similar to those of the second preferred embodiment are achieved. Further, using the configuration of the present preferred embodiment enables to achieve a large capacitance, which cannot be achieved with a capacitor composed of conductor patterns inside the base body, with a surface mount capacitor element. Accordingly, the range of frequencies of an attenuation pole is made wider.

Figure 12A:
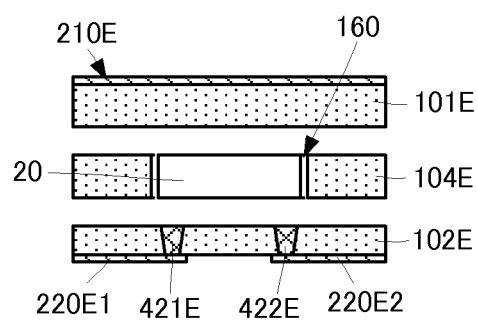
FIG. 12A and FIG. 12B are cross-sectional views for describing a mount structure of a surface mount capacitor element.
Figure 12B:
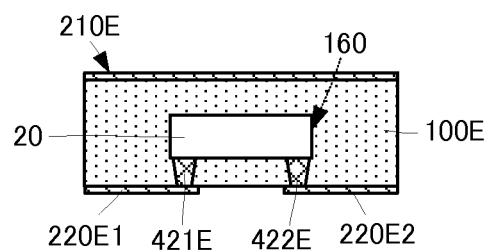

The surface mount capacitor element 20 is installed inside the base body 100E preferably in the following manner. FIG. 12A and FIG. 12B are cross-sectional views for describing a mount structure of the surface mount capacitor element. FIG. 12A is a view depicting a state before performing thermocompression bonding on the base layer, and FIG. 12B is view depicting a state after the thermocompression bonding.

As depicted in FIG. 12A, the base layer 101E, the base layer 104E, and the base layer 102E are stacked. On the base layer 101E, the signal line conductor pattern 210E is formed. On the base layer 102E, the signal line conductor patterns 220E1, 220E2, and the interlayer-connector conductors 421E, 422E are formed. Specifically, in this state, through-holes filled with an electrically conductive paste, which are previous configurations of the interlayer-connector conductors 421E and 422E, are formed in the base layer 102E. At the same time, the capacitor element 20 is disposed inside the through-hole 160 formed on the base layer 104E.

These base layers 101E, 104E, and 102E are subjected to thermocompression bonding to form the base body 100E. At this time, the electrically conductive paste is solidified to form the interlayer-connector conductors 421E and 422E. Further, the interlayer-connector conductors 421E and 422E are electrically and physically connected to external connection terminals of the capacitor element 20. Further, the through-hole 160 is filled by fusing the base layers 101E and 104E, thus fixing the capacitor element 20 with the base body 100E.

Figure 13:
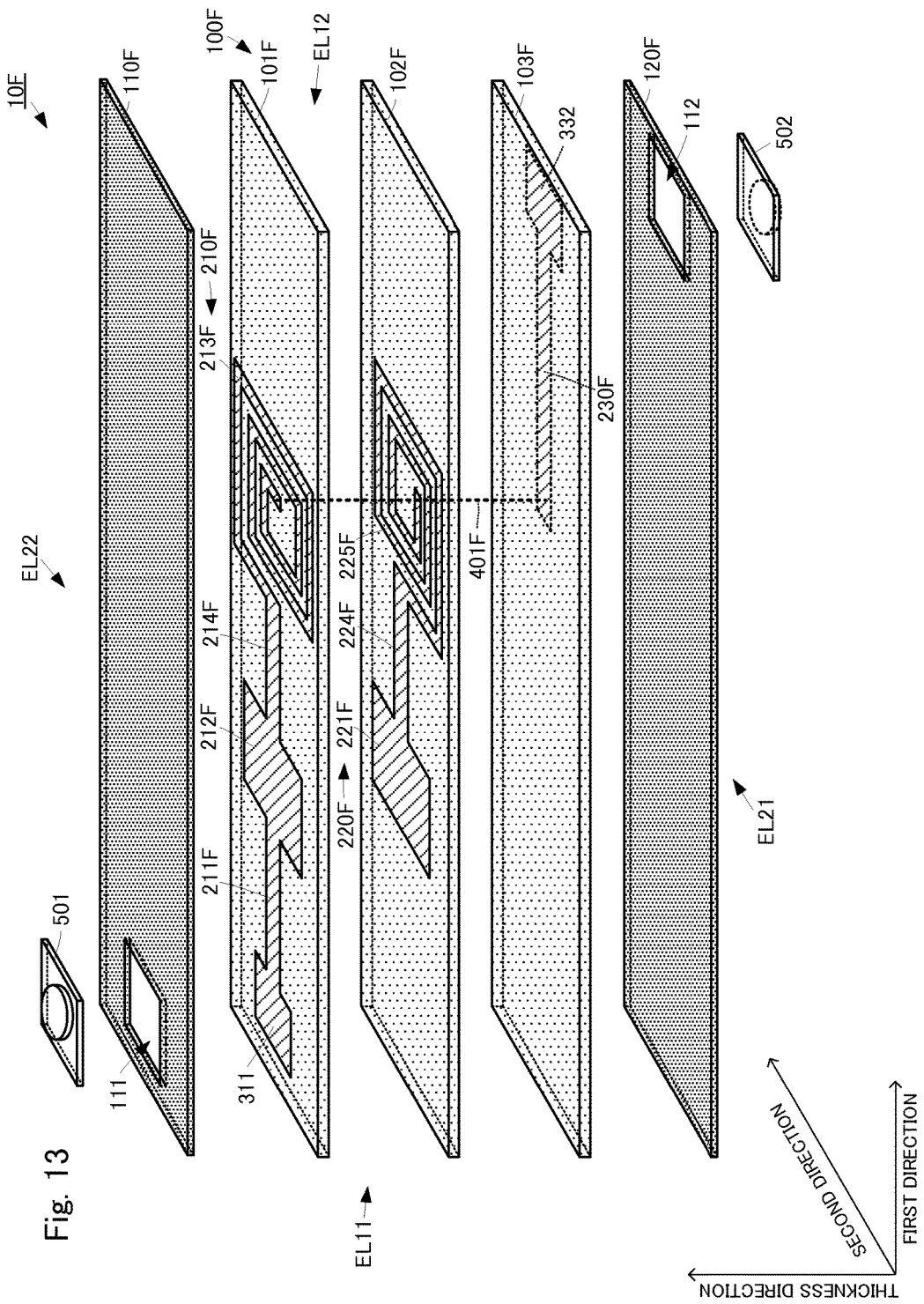
FIG. 13 is an exploded perspective view of a signal transmission cable according to a seventh preferred embodiment of the present invention.

Next, a signal transmission cable according to the seventh preferred embodiment of the present invention is described with reference to the drawings. FIG. 13 is an exploded perspective view of the signal transmission cable according to the seventh preferred embodiment of the present invention. A signal transmission cable 10F of the present preferred embodiment differs from the signal transmission cable 10B described in the third preferred embodiment in that a series resonance inductor is connected in series to the capacitor. Thus, only portions different from the signal transmission cable 10B described in the third preferred embodiment and relevant sections requiring additional descriptions are described in detail.

A base body 100F is formed preferably by stacking base layers 101F, 102F, and 103F in this order. A signal line conductor pattern 220F is provided on the base layer 101F side surface of the base layer 102F. The signal line conductor pattern 220F includes a capacitor conductor portion 221F, a transmission conductor portion 224F, and an inductor conductor portion 225F. The capacitor conductor portion 221F opposes a capacitor conductor portion 212F over the base layer 101F.

The transmission conductor portion 224F is a line conductor extending in the first direction, and connects the capacitor conductor portion 221F and an outer circumferential side end portion of the inductor conductor portion 225F.

The inductor conductor portion 225F includes a line conductor having a spiral shape in planar view. The inductor conductor portion 225F is located at the same or substantially the same location as an inductor conductor portion 213F of the base layer 101F in the first direction. A center-side end portion of the inductor conductor portion 225F is connected to, via an interlayer-connector conductor 401F, a center-side end portion of the inductor conductor portion 213F and a signal line conductor pattern 230F in the base layer 103F, which will be described below.

The signal line conductor pattern 230F and the external connection conductor 332 are provided on the base layer 103F at a surface opposite to the base layer 102F. The external connection conductor 332 is located in the vicinity of an EL12 end portion of the base layer 103F. The signal line conductor pattern 230F includes a line conductor extending in the first direction. An EL11 side end portion of the signal line conductor pattern 230F is connected to center-side end portions of the inductor conductor portion 213F and 225F via the interlayer-connector conductor 401F. An end portion of the signal line conductor pattern 230F on the EL12 end portion side is connected to the external connection conductor 332.

Figure 14:
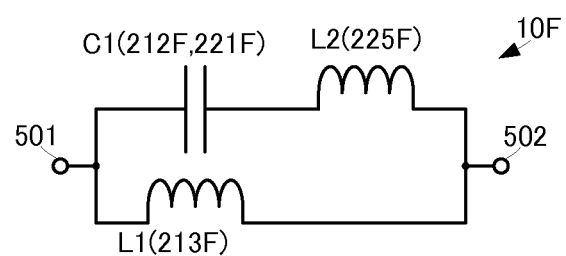
FIG. 14 is an equivalent circuit diagram of a signal transmission cable according to the seventh preferred embodiment of the present invention.

Further, using the configuration of the present preferred embodiment makes it possible to realize a band-elimination filter circuit whose equivalent circuit is depicted in FIG. 14. FIG. 14 is an equivalent circuit diagram of the signal transmission cable according to the seventh preferred embodiment of the present invention.

As depicted in FIG. 14, the signal transmission cable 10F of the present preferred embodiment has a circuit configuration in which a parallel circuit is connected between the external connection conductors 501 and 502, the parallel circuit including an inductor L1 and a series resonance circuit of a capacitor C1 and an inductor L2. The inductor L1 is realized with the inductor conductor portion 213F having the spiral shape. The capacitor C1 is realized with the capacitor conductors 212F and 221F opposing each other and the base layer 101F sandwiched between the capacitor conductors 212F and 221F. The inductor L2 is realized with the inductor conductor portion 225F having the spiral shape.

Lines connecting in parallel the inductor L1 and the series resonance circuit of the capacitor C1 and the inductor L2 are realized with the interlayer-connector conductor 401F and a transmission conductor portion 214F that connects the inductor conductor portion 213F and the capacitor conductor 212F.

AS described above, by using the configuration of the present preferred embodiment, the signal transmission cable 10F including an LC parallel resonance circuit, to which an LC series resonance circuit is added, is realized. Further, this LC parallel resonance circuit works as a band-elimination filter whose attenuation pole frequency is set at a desired frequency by adjusting values of elements. Further, this LC series resonance circuit works as a bandpass filter that passes a desired frequency band by adjusting values of elements. Setting up this passband at a frequency band of communication signals desired to transmit enables to realize a band-elimination filter that transmits desired communication signals with still less loss and attenuates communication signals desired to attenuate.

Figure 15:
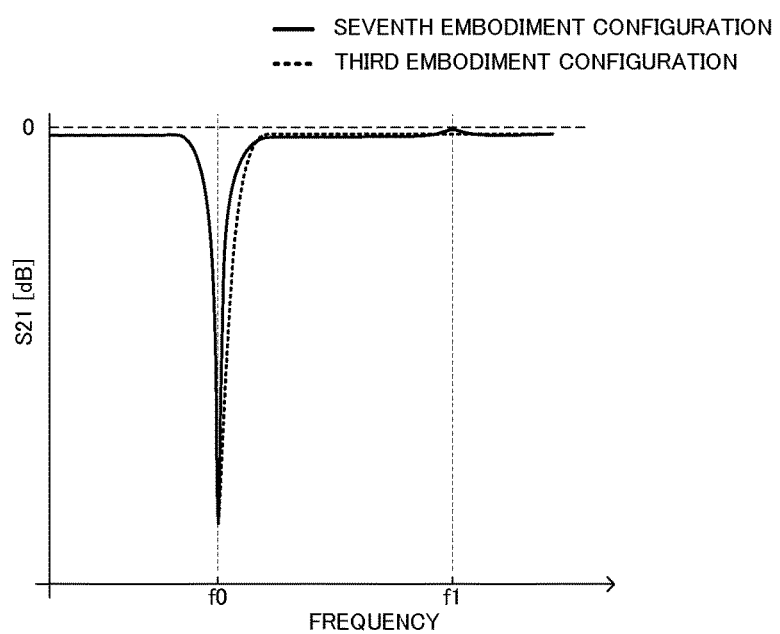
FIG. 15 is a graph depicting bandpass characteristic of a signal transmission cable according to the seventh preferred embodiment of the present invention and bandpass characteristic of a combined structure of the signal transmission cable of the third preferred embodiment and a band-elimination filter element.

FIG. 15 is a graph depicting the bandpass characteristic of a signal transmission cable according to the seventh preferred embodiment of the present invention and the bandpass characteristic of a combined structure of the signal transmission cable of the third preferred embodiment and a band-elimination filter element. As depicted in FIG. 15, compared with the signal transmission cable 10C described in the third preferred embodiment, the signal transmission cable 10F of the present preferred embodiment can reduce bandpass loss at a frequency band that includes a desired frequency f1 (resonance frequency of the LC series resonance circuit) on the high frequency band side of the attenuation pole while achieving a comparable attenuation level at the attenuation pole frequency. Further, the width of attenuation band at the high frequency side of the attenuation pole frequency is made narrower.

In the configuration of the present preferred embodiment, the winding direction of the inductor conductor portion 213F and the winding direction of the inductor conductor portion 225F are opposite to each other in planar view. However, the inductor conductor portion 213F and the inductor conductor portion 225F may have the same winding direction. These may be arbitrarily determined, for example, based on required filter characteristics.

Figure 16:
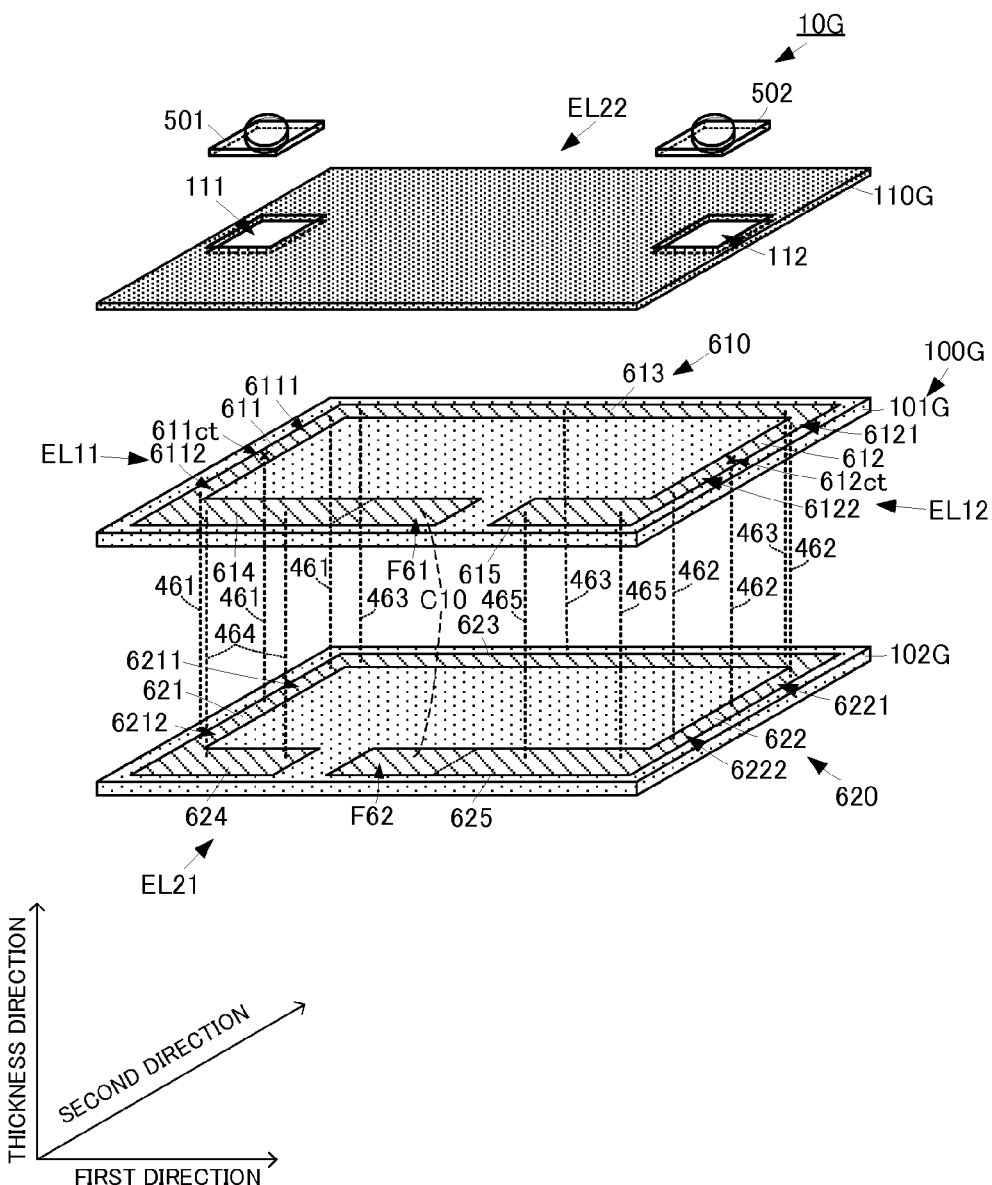
FIG. 16 is an exploded perspective view of a signal transmission cable according to an eighth preferred embodiment of the present invention.
Figure 17:
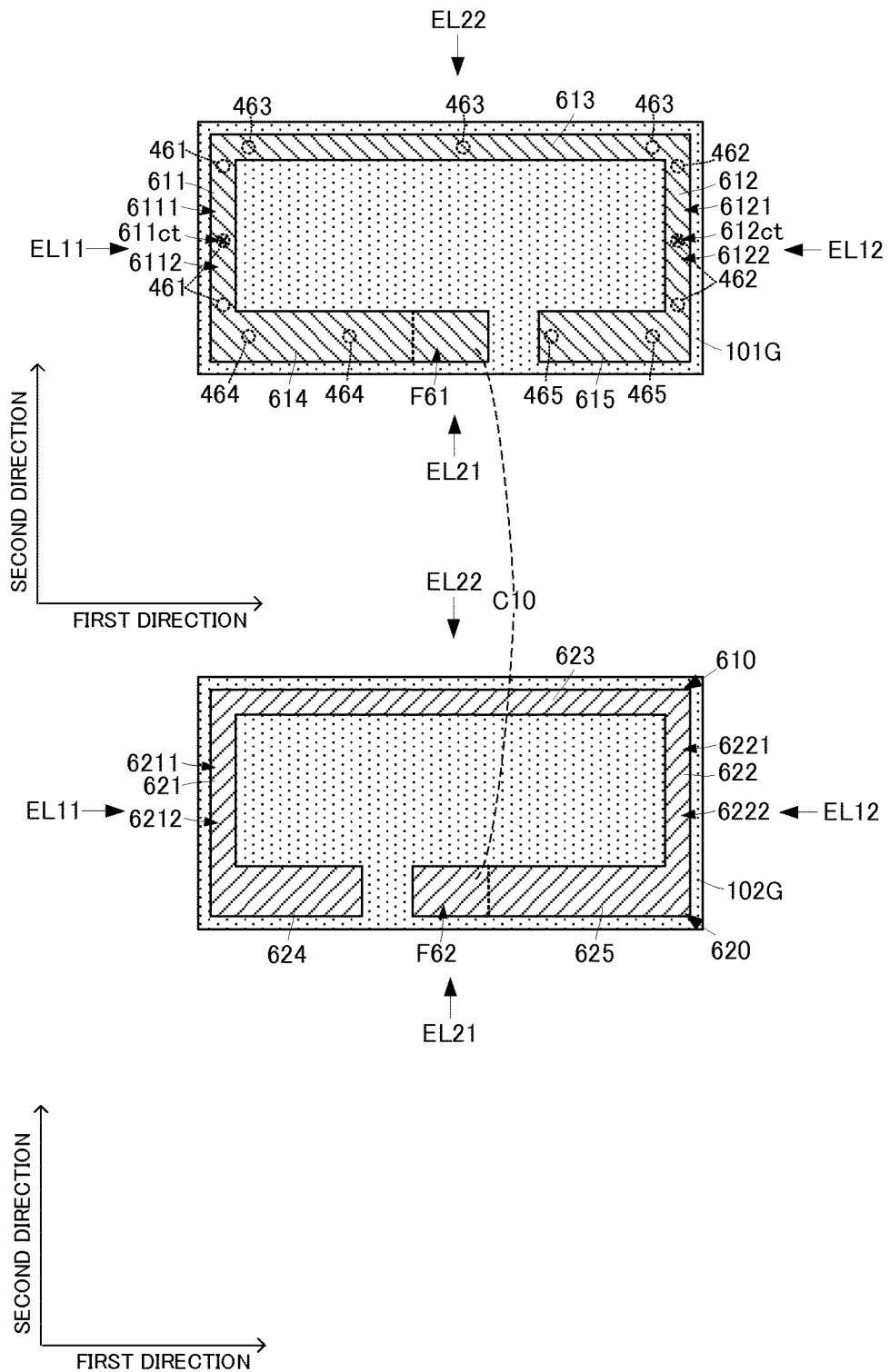
FIG. 17 is plan views of conductor patterns in respective base layers of a signal transmission cable according to the eighth preferred embodiment of the present invention.

Next, a signal transmission cable according to the eighth preferred embodiment of the present invention is described with reference to the drawings. FIG. 16 is an exploded perspective view of the signal transmission cable according to the eighth preferred embodiment of the present invention. FIG. 17 is plan views of conductor patterns in respective base layers of the signal transmission cable according to the eighth preferred embodiment of the present invention.

As depicted in FIG. 16 and FIG. 17, a signal transmission cable 10G includes a flat base body 100G extending in two directions, the first direction and the second direction. The thickness of the base body 100G may be arbitrarily determined, and preferably is about 0.2 mm to 0.5 mm, for example. An insulating resist film 110G is provided on one of flat surfaces (surfaces parallel to the first direction and the second direction) of the base body 100G so as to cover substantially the entire area thereof.

The base body 100G is formed preferably by stacking a base layer 101G and a base layer 102G. The base layers 101G and 102G are each composed of a flexible insulating flat film such as, for example, a liquid crystal polymer. The base layers 101G and 102G are stacked in this order from the resist film 110G side. In other words, the resist film 110G is provided on a flat surface of the base layer 101G opposite to the base layer 102G.

A signal line conductor pattern 610 (hereinafter, simply referred to as "conductor pattern 610") is provided on the resist film 110G side surface of the base layer 101G. The conductor pattern 610 includes a metal having high electrical conductivity and the like, such as a copper foil and the like. The conductor pattern 610 includes a first conductor portion 611, a second conductor portion 612, a third conductor portion 613, a fourth conductor portion 614, and a fifth conductor portion 615.

The first conductor portion 611 and the second conductor portion 612 each includes a line conductor extending in the second direction. The first conductor portion 611 and the second conductor portion 612 have shapes extending substantially the whole length of the base layer 101G from an EL21 side end portion to an EL22 side end portion. The first conductor portion 611 is located in the vicinity of an EL11 side end portion of the base layer 101G, and the second conductor portion 612 is located in the vicinity of an EL12 side end portion of the base layer 101G.

The third conductor portion 613, the fourth conductor portion 614, and the fifth conductor portion 615 each includes a line conductor extending in the first direction. The widths (length in the second direction) of the fourth conductor portion 614 and the fifth conductor portion 615 are wider than the width of the third conductor portion 613.

The third conductor portion 613 is located in the vicinity of the EL22 side end portion of the base layer 101G. The third conductor portion 613 has a shape extending substantially the whole length of the base layer 101G from the EL11 side end portion to the EL12 side end portion. The EL11 side end portion of the third conductor portion 613 is connected to the first conductor portion 611. The EL12 side end portion of the third conductor portion 613 is connected to the second conductor portion 612.

The fourth conductor portion 614 and the fifth conductor portion 615 are located in the vicinity of the EL21 side end portion of the base layer 101G. The fourth conductor portion 614 has a shape extending from the EL11 side end portion of the base layer 101G to a middle location in the first direction. The EL11 side end portion of the fourth conductor portion 614 is connected to the EL21 side end portion of the first conductor portion 611. The fifth conductor portion 615 has a shape extending from the EL12 side end portion of the base layer 101G to a middle location in the first direction. The EL12 side end portion of the fifth conductor portion 615 is connected to the EL21 side end portion of the second conductor portion 612. An end portion of the fourth conductor portion 614 opposite to the side connecting to the first conductor portion 611 and an end portion of the fifth conductor portion 615 opposite to the side connecting to the second conductor portion 612 are not connected and are separated from each other. The length of the fourth conductor portion 614 in the first direction is longer than the length of the fifth conductor portion 615 in the first direction.

A signal line conductor pattern 620 (hereinafter, simply referred to as "conductor pattern 620") is provided on the base layer 101G side surface of the base layer 102G. The conductor pattern 620 includes a metal having high electrical conductivity and the like, such as a copper foil and the like. The conductor pattern 620 includes a first conductor portion 621, a second conductor portion 622, a third conductor portion 623, a fourth conductor portion 624, and a fifth conductor portion 625.

The first conductor portion 621 and the second conductor portion 622 each includes a line conductor extending in the second direction. The first conductor portion 621 and the second conductor portion 622 have shapes extending substantially the whole length of the base layer 102G from the EL21 side end portion to the EL22 side end portion. The first conductor portion 621 is located in the vicinity of the EL11 side end portion of the base layer 102G, and overlaps with the first conductor portion 611 of the base layer 101G in planar view. The second conductor portion 622 is located in the vicinity of the EL12 side end portion of the base layer 102G, and overlaps with the second conductor portion 612 of the base layer 101G in planar view.

The third conductor portion 623, the fourth conductor portion 624, and the fifth conductor portion 625 each includes a line conductor extending in the first direction. The widths (length in the second direction) of the fourth conductor portion 624 and the fifth conductor portion 625 are wider than the width of the third conductor portion 623.

The third conductor portion 623 is located in the vicinity of the EL22 side end portion of the base layer 102G. The third conductor portion 623 has a shape extending substantially the whole length of the base layer 102G from the EL11 side end portion to the EL12 side end portion. The EL11 side end portion of the third conductor portion 623 is connected to the first conductor portion 621. The EL12 side end portion of the third conductor portion 623 is connected to the second conductor portion 622.

The fourth conductor portion 624 and the fifth conductor portion 625 are located in the vicinity of the EL21 side end portion of the base layer 102G. The fourth conductor portion 624 has a shape extending from the EL11 side end portion of the base layer 102G to a middle location in the first direction. The EL11 side end portion of the fourth conductor portion 624 is connected to the EL21 side end portion of the first conductor portion 621. The fifth conductor portion 625 has a shape extending from the EL12 side end portion of the base layer 102G to a middle location in the first direction. The EL12 side end portion of the fifth conductor portion 625 is connected to the EL21 side end portion of the second conductor portion 622. An end portion of the fourth conductor portion 624 opposite to the side connecting to the first conductor portion 621 and an end portion of the fifth conductor portion 625 opposite to the side connecting to the second conductor portion 622 are not connected and are separated from each other. The length of the fourth conductor portion 624 in the first direction is shorter than the length of the fifth conductor portion 625 in the first direction.

The fourth conductor portion 624 of the conductor pattern 620 is shorter than the fourth conductor portion 614 of the conductor pattern 610 in length in the first direction. The fourth conductor portion 624 overlaps a predetermined-length portion of the fourth conductor portion 614 on the EL11 side in planar view.

The fifth conductor portion 625 of the conductor pattern 620 is longer than the fifth conductor portion 615 of the conductor pattern 610 in length in the first direction. A predetermined-length portion of the fifth conductor portion 625 on the EL12 side overlaps the fifth conductor portion 615 in planar view.

An EL12 side region F61 of the fourth conductor portion 614 of the conductor pattern 610, which does not overlap the fourth conductor portion 624 in planar view, is arranged opposite to an EL11 side region F62 of the fifth conductor portion 625 of the conductor pattern 620, which does not overlap the fifth conductor portion 615 in planar view, over the base layer 101G. These regions F61, F62 and the base layer 101G constitute a capacitor C10.

On the base layer 101G, interlayer-connector conductors 461, 462, 463, 464, and 465 are provided. The interlayer-connector conductors 461, 462, 463, 464, and 465 are formed preferably by filling through-holes that penetrates the base layer 101G with electrically conductive paste and solidifying them. The electrically conductive paste includes an electrically conductive material whose primary component is silver or tin.

The interlayer-connector conductor 461 connects the first conductor portion 611 of the conductor pattern 610 and the first conductor portion 621 of the conductor pattern 620. A plurality of the interlayer-connector conductors 461 is provided along the second direction. This interlayer-connector conductor causes to equate potentials of the first conductor portions 611 and 621, and enables them to function as a single first conductor pattern.

The interlayer-connector conductor 462 connects the second conductor portion 612 of the conductor pattern 610 and the second conductor portion 622 of the conductor pattern 620. A plurality of the interlayer-connector conductors 462 is provided along the second direction. This interlayer-connector conductor causes to equate potentials of the second conductor portions 612 and 622, and enables them to function as a single second conductor pattern.

The interlayer-connector conductor 463 connects the third conductor portion 613 of the conductor pattern 610 and the third conductor portion 623 of the conductor pattern 620. A plurality of the interlayer-connector conductors 463 is provided along the first direction. This interlayer-connector conductor causes to equate potentials of the third conductor portions 613 and 623, and enables them to function as a single third conductor pattern.

The interlayer-connector conductor 464 connects the fourth conductor portion 614 of the conductor pattern 610 and the fourth conductor portion 624 of the conductor pattern 620. A plurality of the interlayer-connector conductors 464 is provided along the first direction. This interlayer-connector conductor causes to equate potentials of the fourth conductor portions 614 and 624, and enables them to function as a single fourth conductor pattern.

The interlayer-connector conductor 465 connects the fifth conductor portion 615 of the conductor pattern 610 and the fifth conductor portion 625 of the conductor pattern 620. A plurality of the interlayer-connector conductors 465 is provided along the first direction. This interlayer-connector conductor causes to equate potentials of the fifth conductor portions 615 and 625, and enables them to function as a single fifth conductor pattern.

Each foregoing conductor pattern defines and functions as an inductor in high frequency.

Connectors 501 and 502 that define and function as the external connection terminals are provided on the resist film 110G side of the base body 100G. The connectors 501 and 502 each has a structure that enables to establish electrical connection between an external circuit board and the signal transmission cable 10G by physically connecting to a connector mount portion of an external circuit board, which is not illustrated in the drawing. The connectors 501 and 502 may be omitted. However, the use of the connectors 501 and 502 makes it possible to improve reliability of connections between the signal transmission cable 10G and first and second external circuit boards.

The connector 501 is disposed at the opening 111 in the resist film 110G and connected to a middle point 611ct of the first conductor portion 611. The connector 502 is disposed at the opening 112 in the resist film 110G and connected to a middle point 612ct of the second conductor portion 612.

Figure 18:
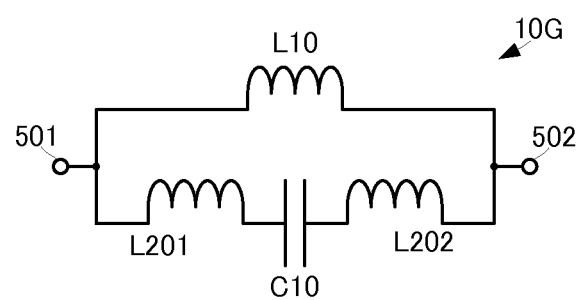
FIG. 18 is an equivalent circuit diagram of a signal transmission cable according to the eighth preferred embodiment of the present invention.

As described above, using the configuration of the present preferred embodiment makes it possible to provide the inductors and the capacitor using the conductor patterns formed on the base layers 101G and 102G. Specifically, using the configuration of the present preferred embodiment makes it possible to realize a band-elimination filter circuit whose equivalent circuit is depicted in FIG. 18. FIG. 18 is an equivalent circuit diagram of the signal transmission cable according to the eighth preferred embodiment of the present invention.

In the signal transmission cable 10G of the present preferred embodiment, inductors L10, L201, L202, and a capacitor C10 are connected between the connectors (external connection terminals) 501 and 502. Specifically, the inductor L201, the capacitor C10, and the inductor L202 are connected in series between the connectors 501 and 502. Further, the inductor L10 is connected in parallel to a series circuit of the inductor L201, the capacitor C10, and the inductor L202.

The inductor L10 includes the third conductor pattern, namely, the third conductor portions 613, 623, and the interlayer-connector conductor 463. More precisely, the inductor L10 also includes additional portions (portions 6111, 6211, 6121, and 6221 in FIG. 16 and FIG. 17) from locations where the first and second conductor patterns are connected to the connectors 501 and 502 to a location where the third conductor pattern is connected and the interlayer-connector conductors 461 and 462 connecting these portions. Each conductor pattern that constitutes this inductor L10 corresponds to a first line conductor pattern.

The inductor L201 includes the fourth conductor pattern, namely, the fourth conductor portions 614, 624, and the interlayer-connector conductor 464. More precisely, the inductor L201 further includes portions (portions 6112 and 6212 in FIG. 16 and FIG. 17) from a location where the first conductor pattern is connected to the connector 501 to a location where the fourth conductor pattern is connected and the interlayer-connector conductor 461 connecting these portions.

The inductor L202 includes the fifth conductor pattern, namely, the fifth conductor portions 615, 625, and the interlayer-connector conductor 465. More precisely, the inductor L202 further includes portions (portions 6122 and 6222 in FIG. 16 and FIG. 17) from a location where the second conductor pattern is connected to the connector 502 to a location where the fifth conductor pattern is connected and the interlayer-connector conductor 462 connecting these portions. The conductor patterns that constitute these inductors L202 and L203 each correspond to a second line conductor pattern.

The capacitor C10 includes, as described above, the region F61 of the fourth conductor portion 614, the region F62 of the fifth conductor portion 625, and the base layer 101G interposed between the regions F61 and F62. As described above, the fourth conductor portions 614 and 624 provided to define the regions F61 and F62 correspond to a first portion, and the fifth conductor portions 615 and 625 correspond to a second portion.

As described above, by using the configuration of the present preferred embodiment, an LC parallel resonance circuit is realized. Further, as is the case with the seventh preferred embodiment, a band-elimination filter is provided and includes an attenuation pole frequency that is set at a first desired frequency f0 and that has a local maximum, at which the transmission loss is decreased, at a second desired frequency f1 in its passband. Further, a signal transmission cable with band-elimination filter functionality is realized.

Further, in the configuration of the present preferred embodiment, the conductor pattern that constitutes the inductor includes two layers, and these two layers are connected by the interlayer-connector conductor. Thus, the series resistance of the inductor is significantly reduced compared with the case where the conductor pattern includes only one single layer. Further, the series resistance of the inductor is significantly reduced without widening the width of the conductor pattern that constitutes the inductor. This improves the Q value of the inductor. Accordingly, a high-Q value LC parallel resonance circuit, namely, a band-elimination filter with steep attenuation characteristic is realized.

Further, in the configuration of the present preferred embodiment, the conductor pattern that constitutes the inductor includes two layers, and the conductor pattern in these two layers are cut in the middle at locations different from each other. The capacitor is formed preferably by arranging conductor portions in the vicinities of cut sections to face each other. In this way, no additional capacitor conductor pattern is needed, and the band-elimination filter of the LC parallel resonance circuit is made smaller.

The number of the interlayer-connector conductors may be varied as needed. For example, the interlayer-connector conductors 463 at the middle positions of the third conductor portions 613 and 623 in the first direction may be omitted, or inversely the number of the interlayer-connector conductor 463 may be increased. In a case where the interlayer-connector conductors 463 at the middle position are omitted, bendability of the signal transmission cable 10G increases. However, at the same time, magnetic field due to a current flowing through the third conductor portion 613 and magnetic field due to a current flowing through the third conductor portion 623 are prone to pass through between the third conductor portions 613 and 623. This may slightly reduce the Q value in some cases. On the other hand, in a case where the number of the interlayer-connector conductors 463 is increased, the Q value does not decrease. However, overall stiffness becomes higher, and the bendability of the signal transmission cable 10G decreases. Accordingly, the interlayer-connector conductor may be arbitrarily provided in view of such conditions.

Further, in the foregoing configuration, the example is described in which the line widths of the fourth conductor portion and the fifth conductor portion that constitute the capacitors are made wider compared to the line width of the first conductor portion in each layer. Alternatively, these conductor portions may have the same line width. Further, if need arises, it is possible to narrow the line widths of the fourth conductor portion and the fifth conductor portion that constitute the capacitors compared to the line width of the first conductor portion in each layer.

Figure 19:
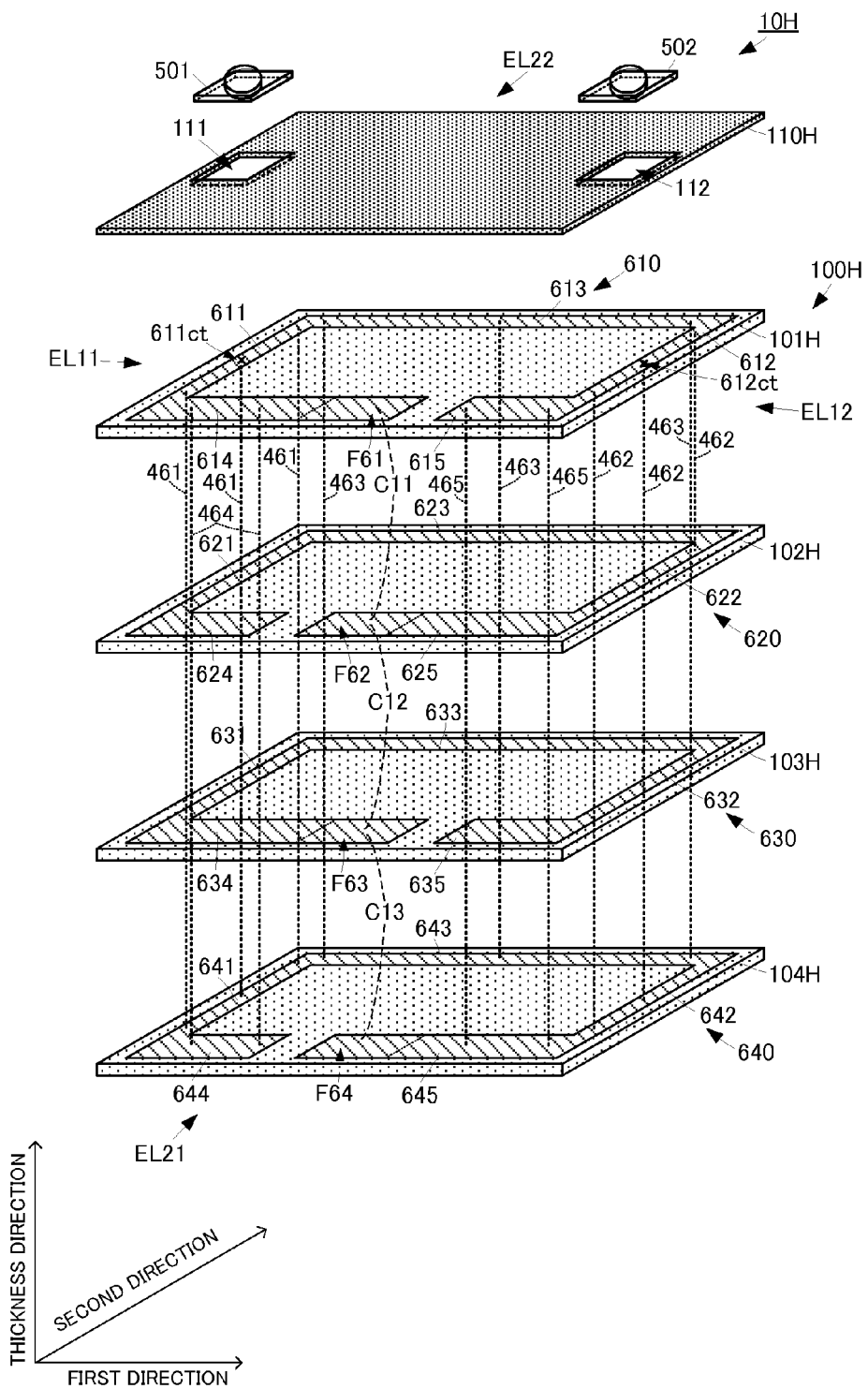
FIG. 19 is an exploded perspective view of a signal transmission cable according to a ninth preferred embodiment of the present invention.

Next, a signal transmission cable according to the ninth preferred embodiment of the present invention is described with reference to the drawings. FIG. 19 is an exploded perspective view of the signal transmission cable according to the ninth preferred embodiment of the present invention. A signal transmission cable 10H of the present preferred embodiment differs from the signal transmission cable 10G described in the eighth preferred embodiment in the number of the base layers that constitute a base body 100H. Thus, only different sections are described in detail.

The base body 100H is formed preferably by stacking base layers 101H, 102H, 103H, and 104H. The base layers 101H, 102H, 103H, and 104H are stacked in this order from a resist film 110H side.

The signal line conductor pattern 610 (hereinafter, simply referred to as "conductor pattern 610") provided on the base layer 101H and the signal line conductor pattern 630 (hereinafter, simply referred to as "conductor pattern 630") provided on the base layer 103H are the same shape as the signal line conductor pattern 610 described in the eighth preferred embodiment.

The signal line conductor pattern 620 (hereinafter, simply referred to as "conductor pattern 620") provided on the base layer 102H and the signal line conductor pattern 640 (hereinafter, simply referred to as "conductor pattern 640") provided on the base layer 104H are the same shape as the signal line conductor pattern 620 described in the eighth preferred embodiment.

A first conductor portion 611 of the conductor portion 610, a first conductor portion 621 of the conductor pattern 620, a first conductor portion 631 of the conductor pattern 630, and a first conductor portion 641 of the conductor pattern 640 are connected by a plurality of interlayer-connector conductors 461 penetrating through the base layers 101H, 102H, and 103H.

A second conductor portion 612 of the conductor pattern 610, a second conductor portion 622 of the conductor pattern 620, a second conductor portion 632 of the conductor pattern 630, and a second conductor portion 642 of the conductor pattern 640 are connected by a plurality of interlayer-connector conductors 462 penetrating through the base layers 101H, 102H, and 103H.

A third conductor portion 613 of the conductor pattern 610, a third conductor portion 623 of the conductor pattern 620, a third conductor portion 633 of the conductor pattern 630, and a third conductor portion 643 of the conductor pattern 640 are connected by a plurality of interlayer-connector conductors 463 penetrating through the base layers 101H, 102H, and 103H.

A fourth conductor portion 614 of the conductor pattern 610, a fourth conductor portion 624 of the conductor pattern 620, a fourth conductor portion 634 of the conductor pattern 630, and a fourth conductor portion 644 of the conductor pattern 640 are connected by a plurality of interlayer-connector conductors 464 penetrating through the base layers 101H, 102H, and 103H.

A fifth conductor portion 615 of the conductor pattern 610, a fifth conductor portion 625 of the conductor pattern 620, a fifth conductor portion 635 of the conductor pattern 630, and a fifth conductor portion 645 of the conductor pattern 640 are connected by a plurality of interlayer-connector conductors 465 penetrating through the base layers 101H, 102H, and 103H.

A region F61 of the fourth conductor portion 614 of the conductor pattern 610 and a region F62 of the fifth conductor portion 625 of the conductor pattern 620 are arranged opposite to each other over the base layer 101H. This defines a capacitor C11.

The region F62 of the fifth conductor portion 625 of the conductor pattern 620 and a region F63 of the fourth conductor portion 634 of the conductor pattern 630 are arranged opposite to each other over the base layer 102H. This defines a capacitor C12.

The region F63 of the fourth conductor portion 634 of the conductor pattern 630 and a region F64 of the fifth conductor portion 645 of the conductor pattern 640 are arranged opposite to each other over the base layer 103H. This defines a capacitor C13.

According to such a configuration, a plurality of the capacitors C11, C12, and C13 are provided, and a range of achievable capacitance is significantly widened.

Further, in the present preferred embodiment, the example is described in which the capacitors are provided in respective base layers. Alternatively, the capacitor may not be provided in some base layers. For example, the conductor pattern 620 and the conductor pattern 630 may have the same shape, and the conductor pattern 610 and the conductor pattern 640 may have the same shape. Further, the areas opposing over the base layer may be made different for each base layer. This makes it possible to further widen the range of achievable capacitance.

In the present preferred embodiment, pairs of the same shape conductor patterns are preferably provided. Alternatively, in such a configuration, one of the pairs of the conductor patterns may be replaced with a single conductor pattern, and this single conductor pattern may be sandwiched between two conductor patterns having the same shape. Further, by applying this alternative configuration, an odd number of the conductor patterns may be used.

Further, using the configuration of the present preferred embodiment makes it possible to provide each inductor with four layers of conductor patterns. This further reduces the series resistance of each inductor, and the Q value is further improved.

Figure 20:
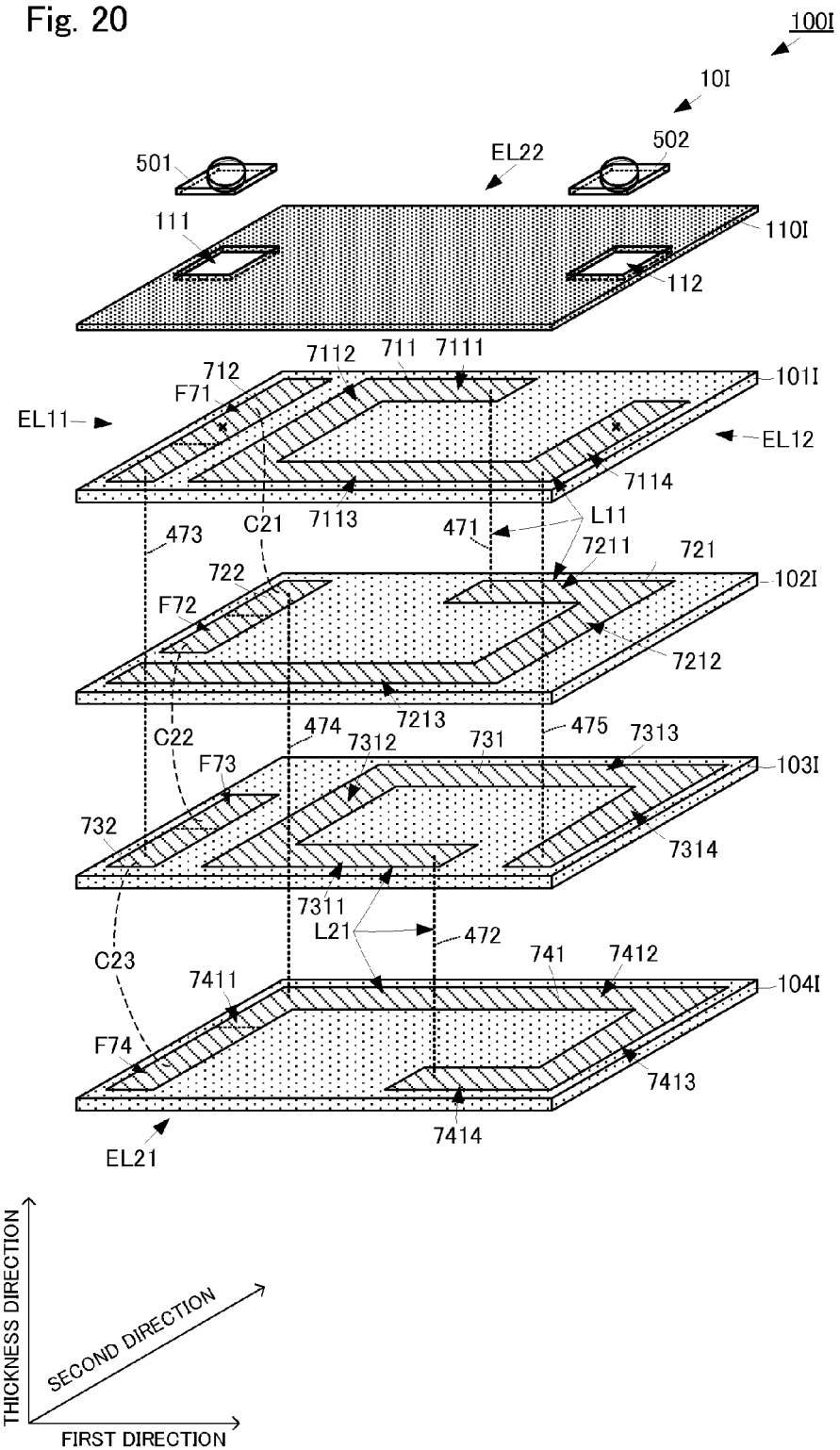
FIG. 20 is an exploded perspective view of a signal transmission cable according to a tenth preferred embodiment of the present invention.
Figure 21:
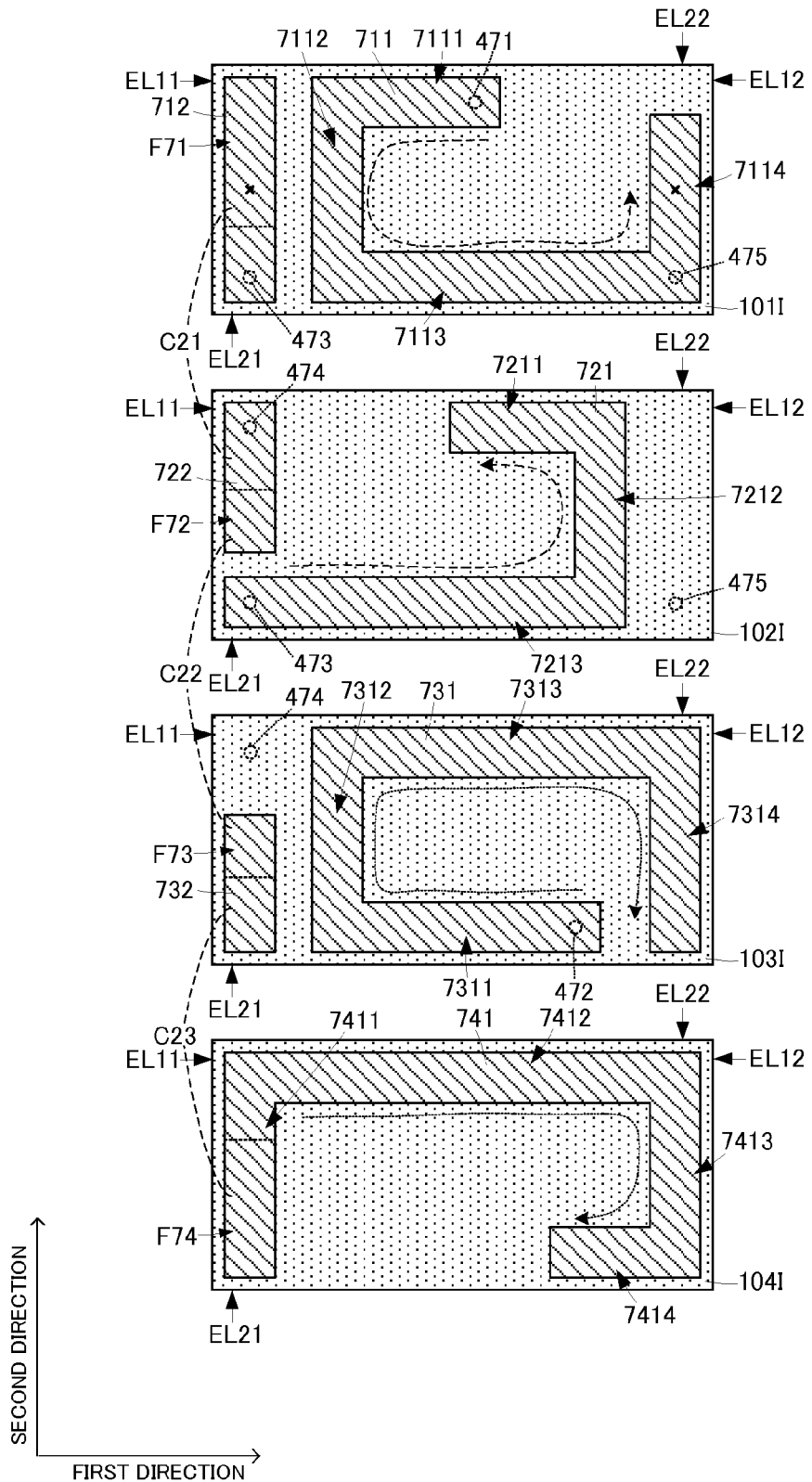
FIG. 21 is plan views of conductor patterns in respective base layers of a signal transmission cable according to the tenth preferred embodiment of the present invention.

Next, a signal transmission cable according to the tenth preferred embodiment of the present invention is described with reference to the drawings. FIG. 20 is an exploded perspective view of the signal transmission cable according to the tenth preferred embodiment of the present invention. FIG. 21 is plan views of conductor patterns in respective base layers of the signal transmission cable according to the tenth preferred embodiment of the present invention.

As depicted in FIG. 20 and FIG. 21, a signal transmission cable 10I includes a flat base body 100I extending in two directions, the first direction and the second direction. The thickness of the base body 100I may be arbitrarily determined, and preferably is about 0.5 mm, for example. An insulating resist film 110I is provided on one of flat surfaces (surfaces parallel to the first direction and the second direction) of the base body 100I so as to cover substantially the entire area thereof.

The base body 100I is formed preferably by stacking base layers 101I, 102I, 103I, and 104I. The base layers 101I, 102I, 103I, and 104I each includes a flexible insulating flat film such as, for example, a liquid crystal polymer. The base layers 101I, 102I, 103I, and 104I are stacked in this order from the resist film 110I side. In other words, the insulating resist film 110I is provided on a flat surface of the base layer 101I opposite to the base layer 102I.

Signal line conductor patterns 711 and 712 (hereinafter, simply referred to as "conductor patterns 711 and 712") are provided on a resist film 110I side surface of the base layer 101I. The conductor patterns 711 and 712 are composed of a metal having high electrical conductivity and the like, such as a copper foil and the like. The conductor pattern 711 includes a first line portion 7111, a second line portion 7112, a third line portion 7113, and a fourth line portion 7114.

The first line portion 7111 and the third line portion 7113 have shapes extending in the first direction, and the second line portion 7112 and the fourth line portion 7114 have shapes extending in the second direction. The first line portion 7111 is located in the vicinity of an EL22 end portion of the base layer 101I, connected to an interlayer-connector conductor 471, which will be described below, at one end portion, and connected to one end portion of the second line portion 7112 at the other end portion. The second line portion 7112 is located in a region of the base layer 101I on an EL11 end portion side, connected to the first line portion 7111 at one end portion, and connected to one end portion of the third line portion 7113 at the other end portion. The third line portion 7113 is located in the vicinity of an EL21 end portion of the base layer 101I, connected to the second line portion 7112 at one end portion, and connected to one end portion of the fourth line portion 7114 at the other end portion. The fourth line portion 7114 is located in the vicinity of an EL12 end portion of the base layer 101I, and connected to the third line portion 7113 at one end portion.

According to such a configuration, the conductor pattern 711 has a loop-shaped portion of which is cut off in planar view, namely, a C-loop shape.

The conductor pattern 712 has a shape extending the whole length from the EL21 end portion to the EL22 end portion in the second direction, and is located between the EL11 end portion of the base layer 101I and the conductor pattern 711 while being separated from the conductor pattern 711.

Signal line conductor patterns 721 and 722 (hereinafter, simply referred to as "conductor patterns 721 and 722") are located on a base layer 101I side surface of the base layer 102I. The conductor patterns 721 and 722 are composed of a metal having high electrical conductivity and the like, such as a copper foil and the like. The conductor pattern 721 includes a first line portion 7211, a second line portion 7212, and a third line portion 7213.

The first line portion 7211 and the third line portion 7213 have shapes extending in the first direction, and the second line portion 7212 has a shape extending in the second direction. The first line portion 7211 is located in the vicinity of an EL22 end portion of the base layer 102I, connected to the interlayer-connector conductor 471, which will be described below, at one end portion, and connected to one end portion of the second line portion 7212 at the other end portion. The second line portion 7212 is provided in a region of the base layer 102I on an EL12 end portion side, connected to the first line portion 7211 at one end portion, and connected to one end portion of the third line portion 7213 at the other end portion. The third line portion 7213 is located in the vicinity of an EL21 end portion of the base layer 102I, and connected to the second line portion 7212 at one end portion. The third line portion 7213 has a shape extending the whole length from an EL11 side end portion to an EL12 side end portion.

According to such a configuration, the conductor pattern 721 includes a loop-shaped portion of which is cut off in planar view, namely, a C-loop shape.

The conductor pattern 722 has a shape extending in the second direction between the EL21 end portion and the third line portion 7213 of the conductor pattern 721, and is separated from the conductor pattern 721. The conductor pattern 722 and a region F71 of the conductor pattern 712 are arranged opposite to each other over the base layer 101I. This defines a capacitor C21.

Signal line conductor patterns 731 and 732 (hereinafter, simply referred to as "conductor patterns 731 and 732") are provided on a base layer 102I side surface of the base layer 103I. The conductor patterns 731 and 732 are composed of a metal having high electrical conductivity and the like, such as a copper foil and the like. The conductor pattern 731 includes a first line portion 7311, a second line portion 7312, a third line portion 7313, and a fourth line portion 7314.

The first line portion 7311 and the third line portion 7313 have shapes extending in the first direction, and the second line portion 7312 and the fourth line portion 7314 have shapes extending in the second direction. The first line portion 7311 is located in the vicinity of an EL21 end portion of the base layer 103I, connected to the interlayer-connector conductor 472, which will be described below, at one end portion, and connected to one end portion of the second line portion 7312 at the other end portion. The second line portion 7312 is located in a region of the base layer 103I on an EL11 end portion side, connected to the first line portion 7311 at one end portion, and connected to one end portion of the third line portion 7313 at the other end portion. The third line portion 7313 is located in the vicinity of an EL22 end portion of the base layer 103I, connected to the second line portion 7312 at one end portion, and connected to the fourth line portion 7314 at the other end portion. The fourth line portion 7314 is located in the vicinity of an EL12 end portion of the base layer 103I, connected to the third line portion 7313 at one end portion, and has a shape extending the whole length from the EL21 end portion to the EL22 end portion.

The conductor pattern 732 has a shape extending in the second direction from the EL21 end portion for a predetermined length, which does not reach the EL22 end portion. Specifically, the conductor pattern 732 has a shape extending in the second direction except a region where an interlayer-connector conductor 474, which will be described below, can be provided. The conductor pattern 732 is separated from the conductor pattern 731. A region F73 of the conductor pattern 732 and a region F72 of the conductor pattern 722 are arranged opposite to each other over the base layer 102I. This defines a capacitor C22.

Signal line conductor patterns 741 and 742 (hereinafter, simply referred to as "conductor patterns 741 and 742") are provided on a base layer 103I side surface of the base layer 104I. The conductor patterns 741 and 742 are composed of a metal having high electrical conductivity and the like, such as a copper foil and the like. The conductor pattern 741 includes a first line portion 7411, a second line portion 7412, a third line portion 7413, and a fourth line portion 7414.

The first line portion 7411 and the third line portion 7413 have shapes extending in the second direction, and the second line portion 7412 and the fourth line portion 7414 have shapes extending in the first direction. The first line portion 7411 is located in the vicinity of an EL11 end portion of the base layer 104I, and has a shape extending the whole length from an EL21 end portion to an EL22 end portion. The second line portion 7412 is located in a region of the base layer 104I on the EL22 end portion side, connected to the first line portion 7411 at one end portion, and connected to one end portion of the third line portion 7413 at the other end portion. The second line portion 7412 has a shape extending the whole length from an EL11 side end portion to an EL12 side end portion. The third line portion 7413 is located in the vicinity of the EL12 end portion of the base layer 104I, connected to the second line portion 7412 at one end portion, and connected to one end portion of the fourth line portion 7414 at the other end portion. The third line portion 7413 has a shape extending the whole length from the EL11 side end portion to the EL12 side end portion. The fourth line portion 7414 is located in the vicinity of the EL21 end portion of the base layer 104I, connected to the third line portion 7413 at one end portion, and connected to an interlayer-connector conductor 472, which will be described below, at the other end portion.

According to such a configuration, the conductor pattern 741 has a loop-shaped portion of which is cut off in planar view, namely, a C-loop shape.

A region F74 of the first line portion 7411 and the conductor pattern 732 are arranged opposite to each other over the base layer 103I. This defines a capacitor C23.

The interlayer-connector conductor 471 connects the conductor patterns 711 and 721, each having the C-loop shape, in a stacking direction. The conductor patterns 711 and 721 connected by the interlayer-connector conductor 471 define a spiral conductor pattern whose axial direction is aligned to the stacking direction of the base layers. This spiral conductor pattern defines an inductor L11.

The interlayer-connector conductor 472 connects the conductor patterns 731 and 741, each having the C-loop shape, in the stacking direction. The conductor patterns 731 and 741 connected by the interlayer-connector conductor 472 define a spiral conductor pattern whose axial direction is aligned to the stacking direction of the base layers. This spiral conductor pattern defines an inductor L21.

An interlayer-connector conductor 473 connects the conductor pattern 712, the conductor pattern 721, and the conductor pattern 732 in the stacking direction. The interlayer-connector conductor 474 connects the conductor pattern 722 and the conductor pattern 741 in the stacking direction. An interlayer-connector conductor 475 connects the conductor pattern 711 and the conductor pattern 731 in the stacking direction.

Connectors 501 and 502 that define and function as external connection terminals are provided on the resist film 110I side of the base body 100I. The connectors 501 and 502 each has a structure that enables to establish electrical connection between an external circuit board and the signal transmission cable 10I by physically connecting to a connector mount portion of an external circuit board, which is not illustrated in the drawings. The connectors 501 and 502 may be omitted. However, the use of the connectors 501 and 502 enables to improve reliability of connections between the signal transmission cable 10I and first and second external circuit boards.

The connector 501 is disposed at the opening 111 in the resist film 110I and connected to the conductor pattern 712. The connector 502 is disposed at the opening 112 in the resist film 110I and connected to the conductor pattern 711.

Figure 22:
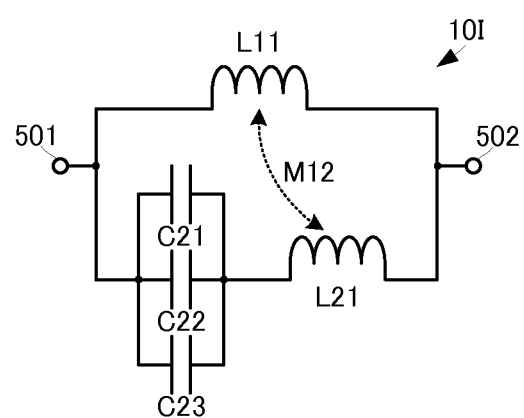
FIG. 22 is an equivalent circuit diagram of a signal transmission cable according to the tenth preferred embodiment of the present invention.

As described above, using the configuration of the present preferred embodiment makes it possible to provide the inductors and the capacitors with the conductor patterns on the base layers 101I, 102I, 103I, and 104I. Specifically, using the configuration of the present preferred embodiment makes it possible to realize a band-elimination filter circuit whose equivalent circuit is depicted in FIG. 22. FIG. 22 is an equivalent circuit diagram of the signal transmission cable according to the tenth preferred embodiment of the present invention.

In the signal transmission cable 10I of the present preferred embodiment, the inductors L11 and L21 and the capacitors C21, C22, and C23 are connected between the connectors (external connection terminals) 501 and 502. Specifically, the inductor L11 and the inductor L21 are connected in parallel between the connectors 501 and 502. The capacitors C21, C22, and C23 are connected in parallel to each other, and this capacitor parallel circuit is connected between the connector 501 and the inductor L21.

The inductor L11 is realized with the spiral conductor pattern including the conductor patterns 711, 721, and the interlayer-connector conductor 471. In the inductor L11, the conductor pattern 721 is connected to the connector 501 via the conductor pattern 712 and the interlayer-connector conductor 473, and the conductor pattern 711 is directly connected to the connector 502.

The inductor L21 is realized with the spiral conductor pattern including the conductor patterns 731, 741, and the interlayer-connector conductor 472. In the inductor L21, the conductor pattern 741 is connected to the connector 501 via the capacitors C21, C22, and C23, and the conductor pattern 731 is connected to the connector 502 via the interlayer-connector conductor 475 and the fourth line portion 7114 of the conductor pattern 711.

As described above, by using the configuration of the present preferred embodiment, an LC parallel resonance circuit is realized. Further, as is the cases with the seventh, eighth, and ninth preferred embodiments, a band-elimination filter is provided with an attenuation pole frequency that is set at the first desired frequency f0 and that has a local maximum, at which the transmission loss is reduced, at the second desired frequency f1 in its passband. Further, a signal transmission cable with band-elimination filter functionality is realized.

Further, using the configuration of the present preferred embodiment makes it possible to realize each inductor with the spiral conductor pattern. Thus, an inductor having a higher Q value compared with inductors having different shapes is realized. Further, in the configuration of the present preferred embodiment, the Q value of inductor is further improved since the spiral inductor is has a largest possible dimension or radius of air core portion within the dimension of the base body 100I.

Further, by using the configuration of the present preferred embodiment, in a transmission path from the connector 501 defining and functioning as a starting point to the connector 502 defining and functioning as an ending point, the inductor L11 and the inductor L21 are arranged so as to wind in opposite directions when the base body 100I is viewed in planar view. Further, the conductor patterns 711 and 721 constituting the inductor L11 overlap the conductor patterns 731 and 741 constituting the inductor L21 in planar view. This causes a mutual inductance whose coupling coefficient K is negative (K<0) between the inductors L11 and L21. Adjusting this coupling coefficient makes it possible to adjust attenuation characteristics.

Figure 23:
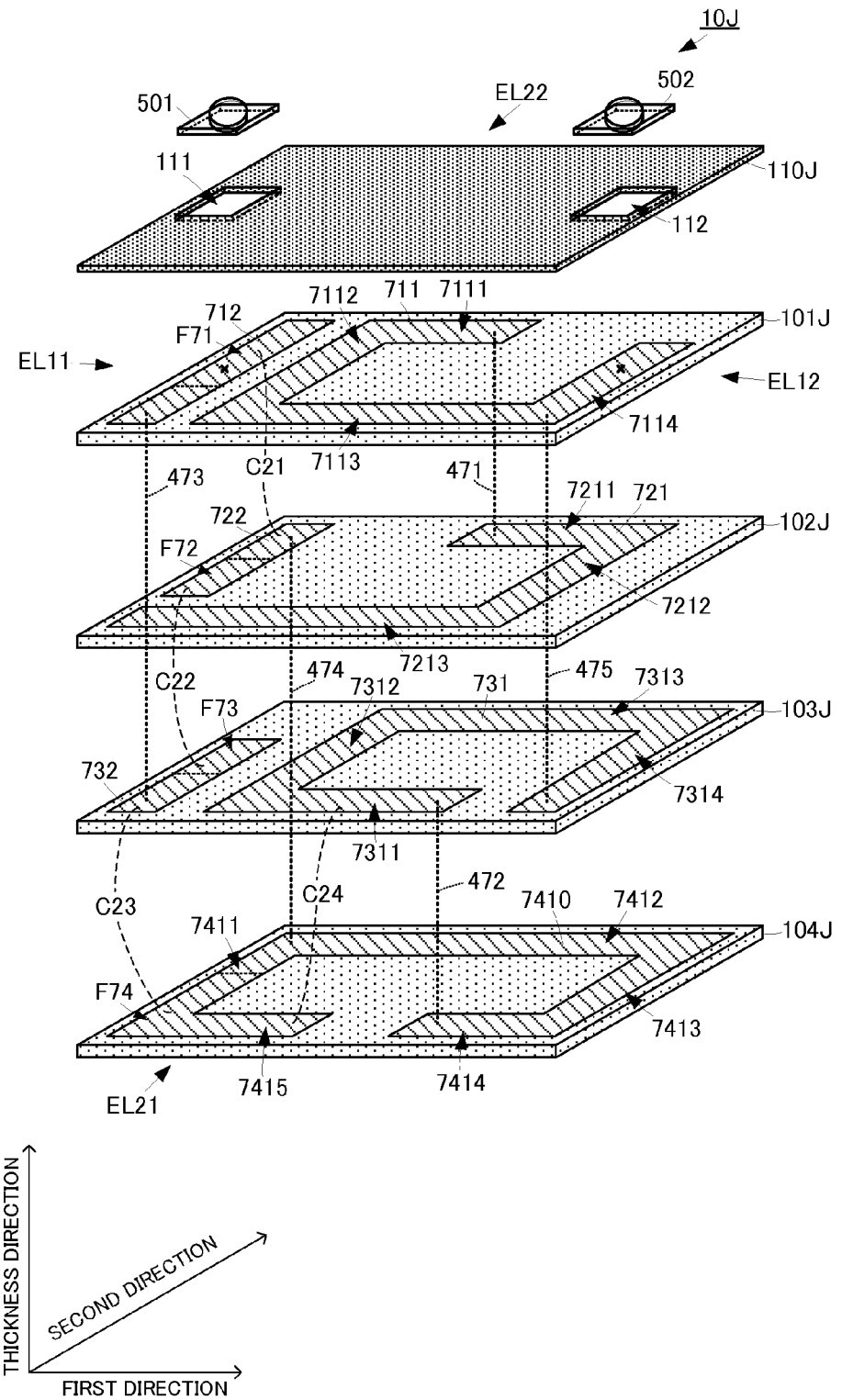
FIG. 23 is an exploded perspective view of a signal transmission cable according to an eleventh preferred embodiment of the present invention.

Next, a signal transmission cable according to the eleventh preferred embodiment of the present invention is described with reference to the drawings. FIG. 23 is an exploded perspective view of the signal transmission cable according to the eleventh preferred embodiment of the present invention.

A signal transmission cable 10J of the present preferred embodiment is preferably configured such that an additional line portion 7415 is added to the conductor pattern 741 of the signal transmission cable 10I described in the tenth preferred embodiment to form a conductor pattern 7410. Thus, only portions different from the signal transmission cable 10I according to the tenth preferred embodiment are described in detail.

The conductor pattern 7410 includes the first line portion 7411, the second line portion 7412, the third line portion 7413, and the fourth line portion 7414, which are the same elements as in the conductor pattern 741, in addition to the additional line portion 7415. The additional line portion 7415 is located in the vicinity of the EL21 end portion of the base layer 104J, and has a shape extending in the first direction. The additional line portion 7415 is connected to the EL21 side end portion of the first line portion 7411. The additional line portion 7415 and the first line portion 7311 of the conductor pattern 731 are arranged opposite to each other over the base layer 103J.

Such a configuration further defines a capacitor C24 connected in parallel to the inductor L21. Such capacitor C24 makes it possible to adjust attenuation characteristics and facilitates achievement of desired attenuation characteristics.

Figure 24:
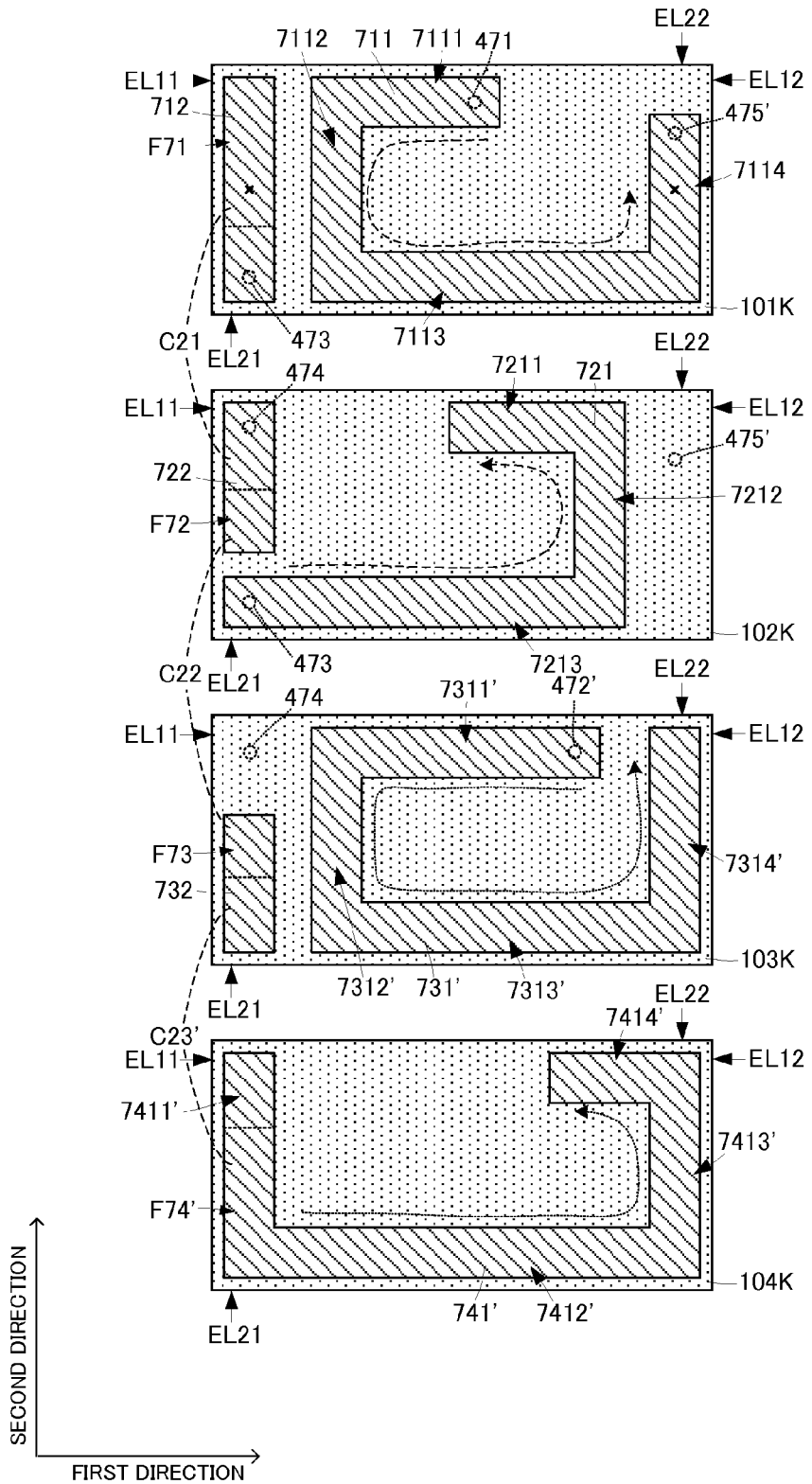
FIG. 24 is plan views of conductor patterns in respective base layers of a signal transmission cable according to a twelfth preferred embodiment of the present invention.

Next, a signal transmission cable according to the twelfth preferred embodiment of the present invention is described with reference to the drawings. FIG. 24 is plan views of conductor patterns in respective base layers of the signal transmission cable according to the twelfth preferred embodiment of the present invention.

A signal transmission cable 10K of the present preferred embodiment differs from the signal transmission cable 10I described in the tenth preferred embodiment in winding directions of conductor patterns 731' and 741' that constitute the inductor L21. In other words, in the transmission path from the connector 501 defining and functioning as a starting point to the connector 502 defining and functioning as an ending point, the inductor L11 and the inductor L21 are arranged so as to wind in the same direction when the base body 100I is viewed in planar view. This results in a mutual inductance whose coupling coefficient K is positive (K>0) between the inductors L11 and L21. Adjusting this coupling coefficient makes it possible to adjust attenuation characteristics.

Figure 25:
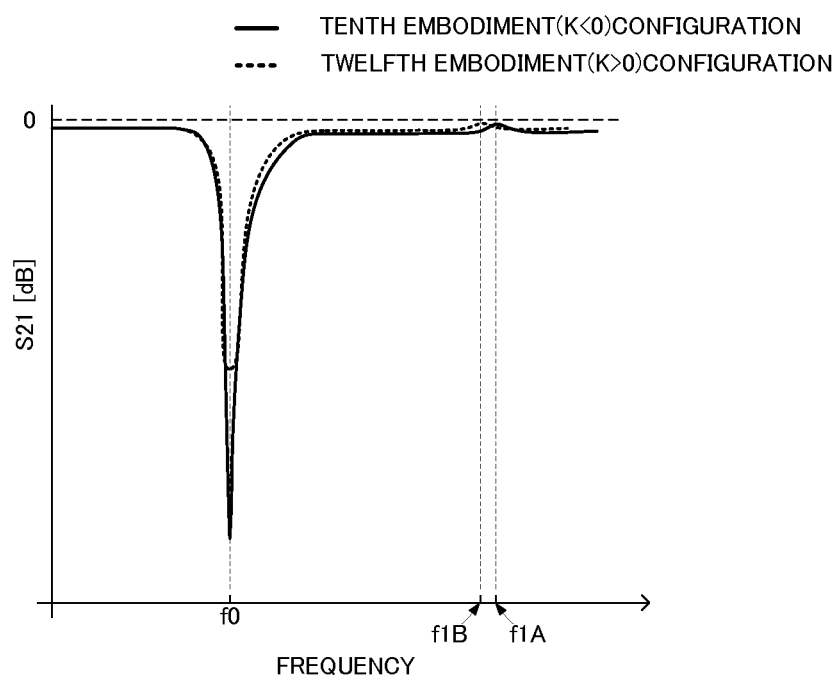
FIG. 25 is a graph depicting bandpass characteristics of the signal transmission cables according to the tenth and twelfth preferred embodiments of the present invention.

FIG. 25 is a graph depicting bandpass characteristics of the signal transmission cables according to the tenth and twelfth preferred embodiments of the present invention. As depicted in FIG. 25, a steep attenuation characteristic is obtained in a case where the inductors L11 and L21 are coupled so as to have a negative coupling coefficient (K<0). Further, as depicted in FIG. 25, in a case where the inductors L11 and L21 are coupled so as to have a positive coupling coefficient (K<0), attenuation characteristics that cannot be achieved with any negative coupling coefficient (K<0) can be achieved. For example, as depicted in FIG. 25, a local maximum of passband is able to be adjusted at a frequency f2A that is different from a frequency f1A of a local maximum of the passband in the configuration with the negative coupling coefficient (K<0). Further, a wider-width attenuation band is obtained on the higher frequency side of the attenuation pole frequency when coupled with a negative coupling coefficient (K<0), and a narrower-width attenuation band is obtained on the higher frequency side of the attenuation pole frequency when coupled with a positive coupling coefficient (K>0). In this way, adjusting the coupling coefficient enables to arbitrarily set up the attenuation characteristics or the bandpass characteristics.

Figure 26:
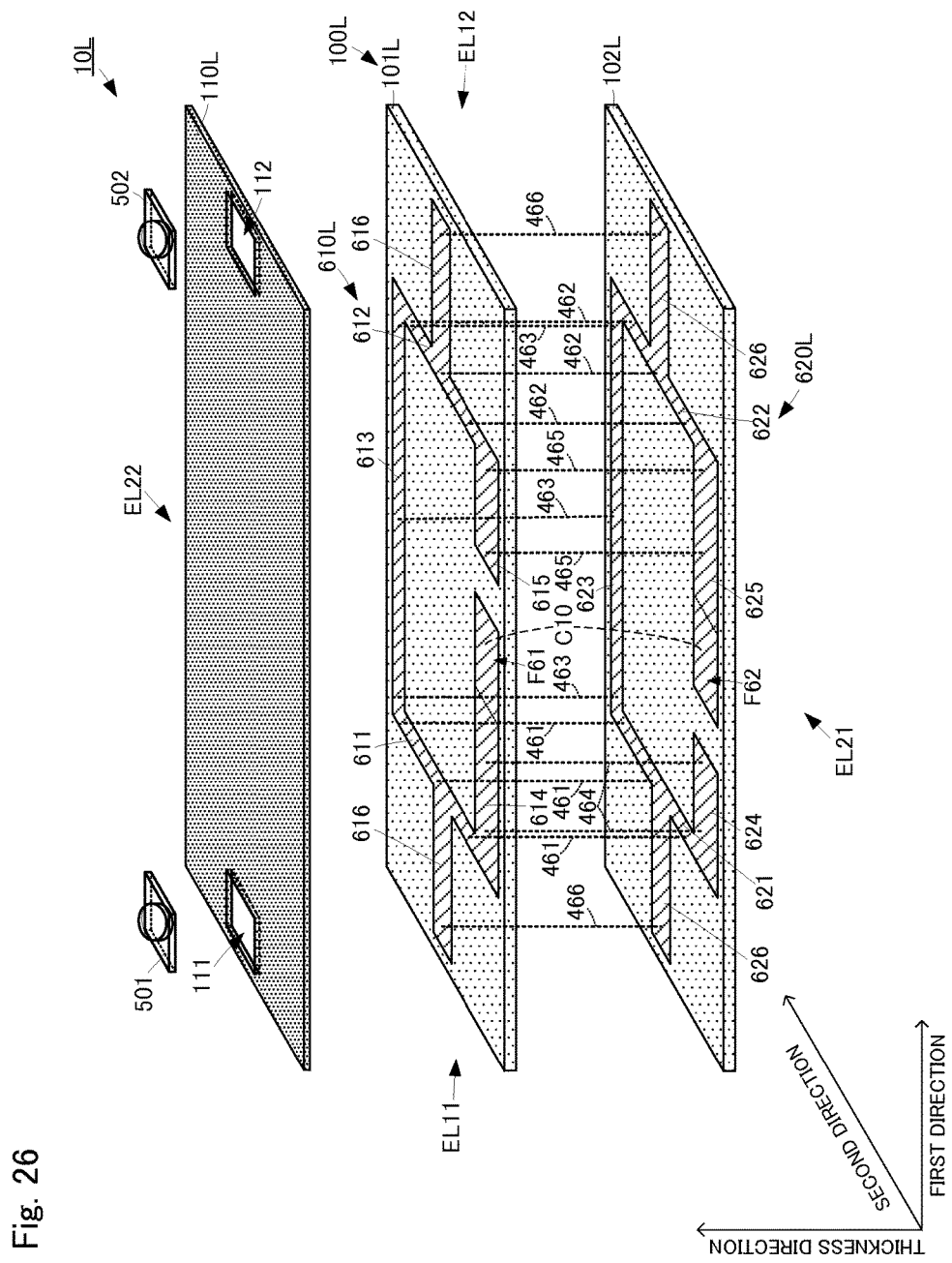
FIG. 26 is an exploded perspective view of a signal transmission cable according to a thirteenth preferred embodiment of the present invention.

Next, a signal transmission cable according to the thirteenth preferred embodiment of the present invention is described with reference to the drawings. FIG. 26 is an exploded perspective view of the signal transmission cable according to the thirteenth preferred embodiment of the present invention.

In the signal transmission cables according to the eighth to eleventh preferred embodiments, the connectors 501 and 502 are directly connected to the conductor patterns constituting a band-elimination filter. However, a signal transmission cable 10L of the present preferred embodiment includes routing conductors in addition to the conductor patterns constituting a band-elimination filter, and these routing conductors are connected to the connectors 501 and 502.

The present preferred embodiment is preferably provided by adding routing conductors 616 and 626 to the signal transmission cable 10G according to the eighth preferred embodiment. Alternatively, the routing conductors 616 and 626 described in the present preferred embodiment may also be applied to the other signal transmission cables according to the eighth to eleventh preferred embodiments.

The routing conductors 616 are provided on a resist film 110L side surface of a base layer 101L. The routing conductors 616 are arranged on both ends of a conductor pattern 610L in the first direction. The routing conductors 616 are each connected to the conductor pattern 610L and each have a shape extending in the first direction. End portions of the routing conductors 616 opposite to end portions connected to the conductor pattern 610L are respectively connected to the connectors 501 and 502.

The routing conductors 626 are provided on a base layer 101L side surface of a base layer 102L. The routing conductors 626 are arranged on both ends of a conductor pattern 620L in the first direction. The routing conductors 626 are each connected to the conductor pattern 620L and each have a shape extending in the first direction. The routing conductors 626 have shapes that overlap the routing conductors 616 in planar view. The routing conductors 626 are connected, by interlayer-connector conductors 466, to the routing conductors 616 that overlap in planar view.

Such a configuration makes it possible to provide the signal transmission cable 10L in an appropriate shape in response to a distance between first and second external circuit boards, which are to be connected to the connectors 501 and 502, without changing the functionality of band-elimination filter.

In the present preferred embodiment, an example is described in which the width of the base body 100L (length in the second direction) is constant between the connectors 501 and 502, namely, for the whole length in the first direction. Alternatively, only the widths of routing conductors 616 and 626 portions may be made narrower.

Alternatively, the routing conductors 626 may be omitted, and the configuration may be provided only with the routing conductors 616. With this configuration, flexibility at portions of the base body where the routing conductors are located can be provided. On the other hand, in a case where the routing conductors 616 and 626 are used, the total direct-current resistance of the routing conductors as a whole is reduced, and the transmission loss is further suppressed or prevented.

Figure 27:
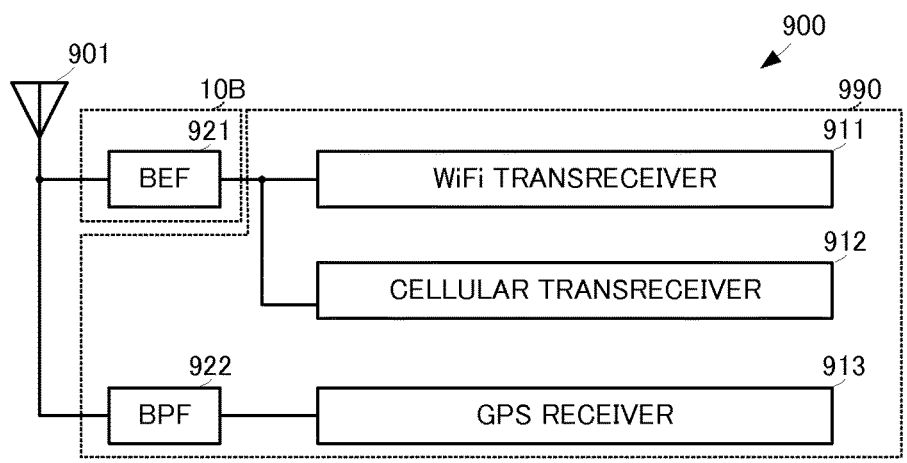
FIG. 27 is a block diagram of a communication device module according to one preferred embodiment of the present invention.
Figure 28:
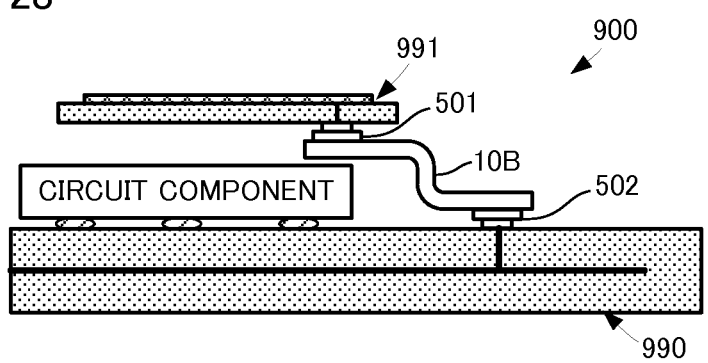
FIG. 28 is a side view depicting a schematic configuration of a communication device module according to a preferred embodiment of the present invention.

The signal transmission cable having the foregoing configuration is applicable to a communication device module, which will be described below. FIG. 27 is a block diagram of a communication device module according to a preferred embodiment of the present invention. FIG. 28 is a side view depicting a schematic configuration of a communication device module according to a preferred embodiment of the present invention. FIG. 27 and FIG. 28 depict a preferred embodiment in which the signal transmission cable 10B described in the third preferred embodiment is used.

As depicted in FIG. 27, a communication device module 900 of the present preferred embodiment preferably includes an antenna 901, a WiFi transceiver 911, a cellular transceiver 912, a GPS receiver 913, a band-elimination filter (BEF) 921, and a bandpass filter (BPF) 922.

The antenna 901 is connected to the WiFi transceiver 911 and the cellular transceiver 912 via the band-elimination filter 921. Further, the antenna 901 is connected to the GPS receiver 913 via the bandpass filter 922.

The WiFi transceiver 911 transmits and receives WiFi communication signals that use a frequency band at, for example, a 2.4 GHz band and the like. The cellular transceiver 912 transmits and receives cellular communication signals that use a frequency band at, for example, a 900 MHz band and the like or a 1.9 GHz band and the like. The GPS receiver 913 receives GPS signals near at 1.5 GHz.

The band-elimination filter 921 attenuates the frequency band of the GPS signals and passes the frequency bands of the WiFi communication signals and the cellular communication signals. The bandpass filter 922 passes the frequency band of the GPS signals and attenuates the frequency bands other than the frequency band of the GPS signals.

The signal transmission cable 10B described in the third preferred embodiment is used in this band-elimination filter 921. By using this signal transmission cable 10B, a band-elimination filter having steep attenuation characteristics and a narrow attenuation band is realized. Accordingly, in a case where the attenuation pole is set at the frequency band of the GPS signals, the GPS signals are attenuated, and other communication signals (for example, 1.9 GHz band for the cellular communication signals) and the like, which are close to the frequency band of the GPS signals, are able to be transmitted without attenuation.

The communication device module 900 having such a circuit configuration includes a front end board 990, an antenna board 991, and the signal transmission cable 10B. On a mount surface of the front end board 990, circuit components that realize the WiFi transceiver 911, the cellular transceiver 912, the GPS receiver 913, and the like are mounted. The antenna 901 is provided on the antenna board 991. The antenna board 991 is arranged on the mount surface side of the front end board 990 in such a manner to be separated from the front end board 990.

As depicted in FIG. 28, the connector 501 of the signal transmission cable 10B is connected to a front end board 990 side surface of the antenna board 991. The connector 502 of the signal transmission cable 10B is connected to an antenna board 991 side surface (mount surface) of the front end board 990. Since the signal transmission cable 10B is flexible, a bent portion is able to be provided in the middle in the extending direction. As described above, providing the bent portion enables the signal transmission cable 10B to connect the front end board 990 and the antenna board 991 while being in a state where the signal transmission cable 10B is arranged so as not to touch the circuit component.

Further, as described above, providing the band-elimination filter in the signal transmission cable 10B eliminates the need to provide the band-elimination filter on the front end board 990 or the antenna board 991. Accordingly, the front end board 990 or the antenna board 991 is much smaller. Further, providing the band-elimination filter in the signal transmission cable 10B improves filter characteristics (attenuation characteristics and bandpass characteristics) of the band-elimination filter. Accordingly, communication characteristics of the communication device module 900 are significantly improved.

Figure 29:
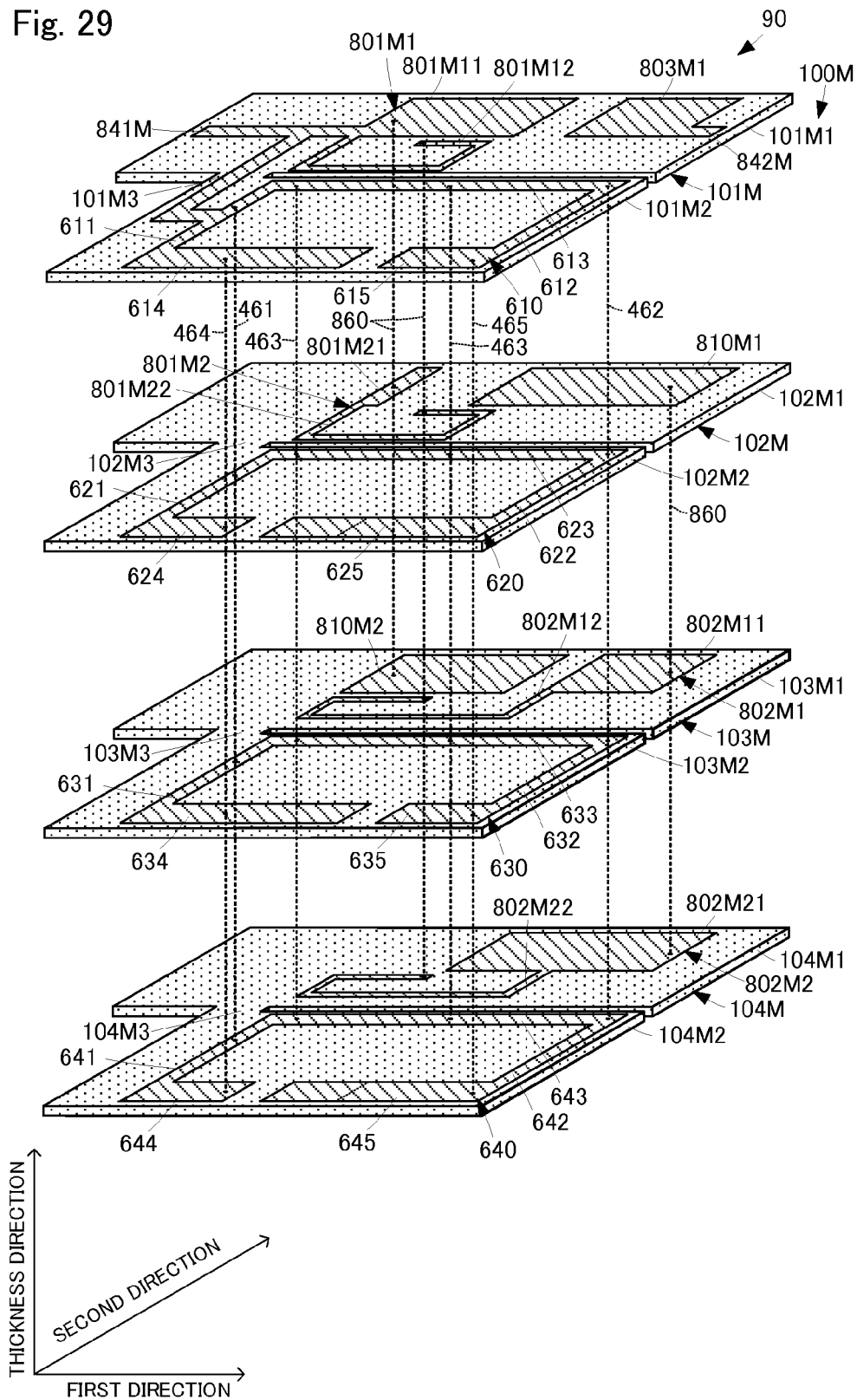
FIG. 29 is an exploded perspective view of a diplexer-type signal transmission cable according to a fourteenth preferred embodiment of the present invention.

Next, a signal transmission cable according to the fourteenth preferred embodiment of the present invention is described with reference to the drawings. FIG. 29 is an exploded perspective view of the signal transmission cable according to the fourteenth preferred embodiment of the present invention. In FIG. 29, a protective layer and connectors are omitted from the illustration.

A diplexer-type signal transmission cable 90 of the present preferred embodiment includes a base body 100M that is formed preferably by stacking base layers 101M, 102M, 103M, and 104M.

The base layer 101M includes partial regions 101M1, 101M2, and 101M3. The partial regions 101M1 and 101M2 have elongated shapes extending in a lengthwise direction and are arranged side by side along the width direction with a gap in between. The partial region 101M3 is arranged at end portions of the partial regions 101M1 and 101M2 in the lengthwise direction and connects the partial regions 101M1 and 101M2. According to this configuration, the base layer 101M has a shape that is separated into two regions in the width direction in the middle in the lengthwise direction.

The base layer 102M includes partial regions 102M1, 102M2, and 102M3. The partial regions 102M1 and 102M2 have elongated shapes extending in a lengthwise direction and are arranged side by side along the width direction with a gap in between. The partial region 102M3 is arranged at end portions of the partial regions 102M1 and 102M2 in the lengthwise direction and connects the partial regions 102M1 and 102M2. The base layer 102M has a shape that is separated into two regions in the width direction in the middle in the lengthwise direction.

The base layer 103M includes partial regions 103M1, 103M2, and 103M3. The partial regions 103M1 and 103M2 have elongated shapes extending in a lengthwise direction and are arranged side by side along the width direction with a gap in between. The partial region 103M3 is disposed at ends of the partial regions 103M1 and 103M2 in the lengthwise direction and connects the partial regions 103M1 and 103M2. The base layer 103M has a shape that is separated into two regions in the width direction in the middle in the lengthwise direction.

The base layer 104M includes partial regions 104M1, 104M2, and 104M3. The partial regions 104M1 and 104M2 have elongated shapes extending in a lengthwise direction and are arranged side by side along the width direction with a gap in between. The partial region 104M3 is disposed at end portions of the partial regions 104M1 and 104M2 in the lengthwise direction and connects the partial regions 104M1 and 104M2. The base layer 104M has a shape that is separated into two regions in the width direction in the middle in the lengthwise direction.

In a second base portion composed of the partial regions 101M2, 102M2, 103M2, and 104M2 in the base body 100M, the same conductor patterns as ones described in the ninth preferred embodiment are provided. Accordingly, a band-elimination filter is realized with the second base portion including the partial regions 101M2, 102M2, 103M2, and 104M2 in the base body 100M.

On a principal surface (one of principal surfaces of the base body 100M) of the base layer 101M in the partial region 101M1 opposite to the base layer 102M side, conductor patterns 801M1 and 803M1 are provided. The conductor pattern 801M1 includes a first portion conductor pattern 801M11 and a second portion conductor pattern 801M12.

The first portion conductor pattern 801M11 and the conductor pattern 803M1 are arranged along the lengthwise direction of the partial region 101M1 with a gap in between. The first portion conductor pattern 801M11 and the conductor pattern 803M1 have the same or substantially the same width, and this width is wider than the width of the second portion conductor pattern 801M12. In term of the functionality, they are provided with widths needed to form the following capacitor.

The second portion conductor pattern 801M12 is arranged adjacent to the first portion conductor pattern 801M11 in the width direction of the partial region 101M1. The second portion conductor pattern 801M12 is a loop-shaped conductor pattern. The loop-shaped conductor pattern has a loop shape, part of which is cut.

A side end portion of the first portion conductor pattern 801M11 on one end portion of the partial region 101M1 is connected to one end portion (outer circumferential side end portion) of the second portion conductor pattern 801M12 near the one end portion of the partial region 101M1. These first portion conductor pattern 801M11 and the second portion conductor pattern 801M12 are connected to a routing conductor pattern 841M formed near the one end portion of the partial region 101M1.

A side end portion of the conductor pattern 803M1 on the other end portion of the partial region 101M1 is connected to a routing conductor pattern 842M located near the other end portion of the partial region 101M1.

On a base layer 101M side principal surface of the base layer 102M in the partial region 102M1, a conductor pattern 801M2 and a capacitive coupling conductor pattern 810M1 are provided. The conductor pattern 801M2 includes a first portion conductor pattern 801M21 and a second portion conductor pattern 801M22.

The first portion conductor pattern 801M21 preferably is rectangular or substantially rectangular and arranged opposite to a portion of the first portion conductor pattern 801M11 over the base layer 101M. The first portion conductor pattern 801M21 is connected to the first portion conductor pattern 801M11 via a connection conductor 860 that passes through the base layer 101M in the thickness direction.

The second portion conductor pattern 801M22 is arranged adjacent to the first portion conductor pattern 801M21 in the width direction of the partial region 102M1. The second portion conductor pattern 801M22 is a loop-shaped conductor pattern. The second portion conductor pattern 801M22 overlaps the second portion conductor pattern 801M12 when viewed in a direction orthogonal to the principal surface. One end portion (outer circumferential side end portion) of the second portion conductor pattern 801M22 is connected to the first portion conductor pattern 801M21. The other end portion (inner circumferential side end portion) of the second portion conductor pattern 801M22 is connected to the other end portion (inner circumferential side end portion) of the second portion conductor pattern 801M12 via the connection conductor 860 that passes through the base layer 101M in the thickness direction.

The capacitive coupling conductor pattern 810M1 preferably is rectangular or substantially rectangular or substantially rectangular and arranged opposite to both the first portion conductor pattern 801M11 and the conductor pattern 803M1 over the base layer 101M. Opposing portions of the capacitive coupling conductor pattern 810M1 and the first portion conductor pattern 801M11 form a capacitor Ct21. Opposing portions of the capacitive coupling conductor pattern 810M1 and the conductor pattern 803M1 define a capacitor Ct10.

On a base layer 102M side principal surface of the base layer 103M in the partial region 103M1, a capacitive coupling conductor pattern 810M2 and a conductor pattern 802M1 are provided. The conductor pattern 802M1 includes a first portion conductor pattern 802M11 and a second portion conductor pattern 802M12.

The capacitive coupling conductor pattern 810M2 and the first portion conductor pattern 802M11 are arranged along the lengthwise direction of the partial region 103M1 with a gap in between. The capacitive coupling conductor pattern 810M2 and the first portion conductor pattern 802M11 have the same or substantially the same width. The capacitive coupling conductor pattern 810M2 is connected to the first portion conductor pattern 801M21 via the connection conductor 860 that passes through the base layer 102M in the thickness direction.

The first portion conductor pattern 802M11 preferably is rectangular or substantially rectangular or substantially rectangular and arranged opposite to a portion of the capacitive coupling conductor pattern 810M1 over the base layer 102M. The first portion conductor pattern 802M11 is connected to the capacitive coupling conductor pattern 810M1 via the connection conductor 860 that passes through the base layer 102M in the thickness direction.

The second portion conductor pattern 802M12 is arranged adjacent to the capacitive coupling conductor pattern 810M2 in the width direction of the partial region 103M1. The second portion conductor pattern 802M12 is a loop-shaped conductor pattern. One end portion (outer circumferential side end portion) of the second portion conductor pattern 802M12 is connected to the first portion conductor pattern 802M11. The other end portion (inner circumferential side end portion) of the second portion conductor pattern 802M12 overlaps the other end portion (inner circumferential side end portion) of the second portion conductor pattern 801M12 when viewed in the direction orthogonal to the principal surface. The other end portion (inner circumferential side end portion) of the second portion conductor pattern 802M12 is connected to the other end portion (inner circumferential side end portion) of the second portion conductor pattern 801M22 via the connection conductor 860 that passes through the base layer 102M in the thickness direction.

The capacitive coupling conductor pattern 810M2 preferably is rectangular or substantially rectangular and arranged opposite to both the first portion conductor pattern 801M21 and the capacitive coupling conductor pattern 810M1 over the base layer 102M. The capacitive coupling conductor pattern 810M2 is connected to the first portion conductor pattern 801M21 via the connection conductor 860 that passes through the base layer 102M in the thickness direction. Opposing portions of the capacitive coupling conductor pattern 810M1 and 810M2 define a capacitor Ct22.

On a base layer 103M side principal surface of the base layer 104M in the partial region 104M1, a conductor pattern 802M2 is provided. The conductor pattern 802M2 includes a first portion conductor pattern 802M21 and a second portion conductor pattern 802M22.

The first portion conductor pattern 802M21 preferably is rectangular or substantially rectangular and arranged opposite to a portion of the capacitive coupling conductor pattern 810M2 and the first portion conductor pattern 802M11 over the base layer 103M. The first portion conductor pattern 802M21 is connected to the first portion conductor pattern 802M11 via the connection conductor 860 that passes through the base layer 103M in the thickness direction. Opposing portions of the first portion conductor pattern 802M21 and the capacitive coupling conductor pattern 810M2 define a capacitor Ct23.

The second portion conductor pattern 802M22 is a loop-shaped conductor pattern. The second portion conductor pattern 802M22 overlaps the second portion conductor pattern 802M12 when viewed in the direction orthogonal to the principal surface. One end portion (outer circumferential side end portion) of the second portion conductor pattern 802M22 is connected to the first portion conductor pattern 802M21. The other end portion (inner circumferential side end portion) of the second portion conductor pattern 802M22 is connected to the other end portion (inner circumferential side end portion) of the second portion conductor pattern 802M12 via the connection conductor 860 that passes through the base layer 103M in the thickness direction.

A spiral-shaped inductor Lt10 having an axial direction along the thickness direction of the base body 100M is formed preferably by arranging the second portion conductor patterns 801M12, 801M22, 802M12, and 802M22 and connecting the inner circumferential side end portions of these conductor patterns with the connection conductor 860 as described above.

Having such a configuration enables to realize a circuit configuration in which a series circuit of the inductor Lt10 and the capacitor Ct10 is connected and the capacitors Ct21, Ct22, and Ct23 are connected in parallel to the inductor Lt10. In other words, a bandpass filter circuit having both LC series resonance and LC parallel resonance is able to be configured.

Further, a diplexer-type signal transmission cable is provided to include a bandpass filter and a band-elimination filter are connected to a common terminal that is realized with the routing conductors 841M.

Figure 30:
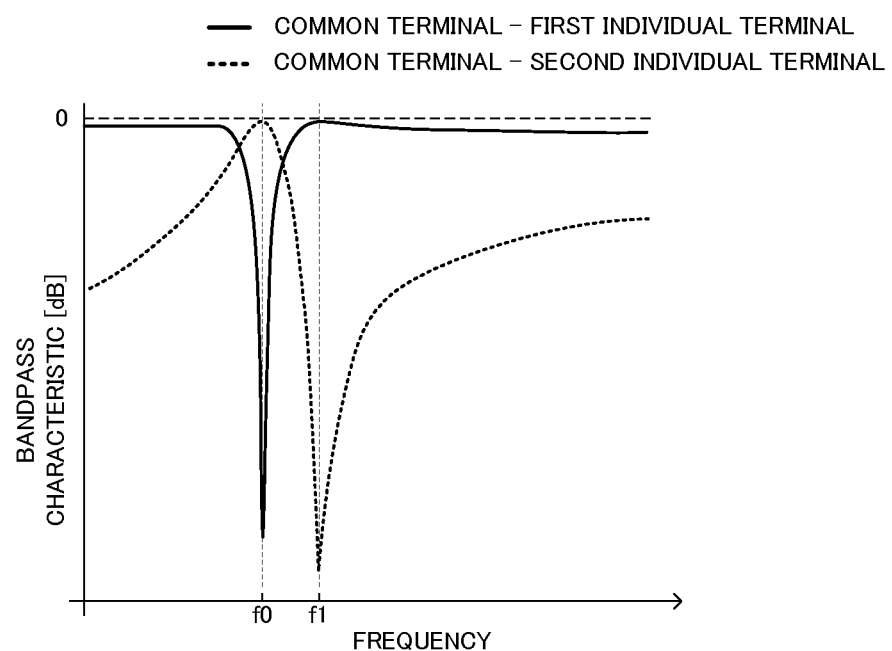
FIG. 30 is a graph depicting transmission characteristics of a diplexer-type signal transmission cable according to the fourteenth preferred embodiment of the present invention.

FIG. 30 is a graph depicting transmission characteristics of a diplexer-type signal transmission cable according to the fourteenth preferred embodiment of the present invention. A solid line in FIG. 30 represents a bandpass characteristic of a transmission path that transmits from the common terminal to a first individual terminal via the band-elimination filter. A dashed line in FIG. 30 represents a bandpass characteristic of a transmission path that transmits from the common terminal to a second individual terminal via the bandpass filter.

As depicted in FIG. 30, between the common terminal and the second individual terminal, a high-frequency signal desired to transmit at frequency f0 is able to be transmitted with low loss, and a high-frequency signal desired to attenuate at frequency f1 is greatly attenuated. Further, between the common terminal and the first individual terminal, a high-frequency signal desired to cut off at the frequency f0 is greatly attenuated, and a high-frequency signal desired to pass at the frequency f1 can be transmitted with low loss.

Here, as depicted in FIG. 30, even in a case where the frequencies f0 and f1 are close to each other, desired transmission characteristics between the terminals is achieved. Specifically, the frequency f0 is a GPS signal frequency at approximately 1.575 GHz, and the frequency f1 is a 1.7 GHz communication band. The GPS signals are transmitted from the common terminal to the second individual terminal. The communication signals are transmitted between the common terminal and the first individual terminal.

In this way, even in a case where the frequency difference is approximately 200 MHz, the GPS signals are transmitted to the second individual terminal with low loss, and transmission of the communication signals to the second individual terminal is greatly reduced. On the other hand, the communication signals are transmitted to the first individual terminal with low loss, and transmission of the GPS signals to the first individual terminal is greatly reduced. In other words, sufficient isolation is secured between the first individual terminal and the second individual terminal in a desired frequency band.

Further, a high-frequency diplexer is realized with the base body 100M, in which the respective conductor patterns are formed preferably by matching the passband of the bandpass filter with the stop band (attenuation band) of the band-elimination filter. This makes it possible to realize a thin high-frequency diplexer having excellent transmission characteristics.

The flat cable type high-frequency diplexer 90 of the present preferred embodiment can be used, for example, for a component including the band-elimination filter (BEF) 921, the bandpass filter (BPF) 922, and the transmission line portion connecting these to the antenna 901, which are depicted in the circuit diagram of FIG. 27.

Further, the flat cable type high-frequency diplexer 90 of the present preferred embodiment can connect, for example, the antenna board 991 and the front end board 990 using a mount mode similar to the one depicted in FIG. 28.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal transmission cable with band-elimination filter functionality, comprising:
    a signal transmission line that connects a first external connection terminal and a second external connection terminal;
    a flexible flat base body in which the signal transmission line is defined by a conductor pattern; and
    a band-elimination filter that is connected between the first external connection terminal and the second external connection terminal by the signal transmission line and includes an inductor and a capacitor provided in or on the flexible flat base body; wherein
    the flexible flat base body includes a bent portion between a position of the first external connection terminal and a position of the second external connection terminal.

2. A communication device module comprising:
    the signal transmission cable with band-elimination filter functionality according to claim 1;
    an antenna board connected to the first external connection terminal; and
    a front end board connected to the second external connection terminal.

3. A signal transmission cable with band-elimination filter functionality, comprising:
    a signal transmission line that connects a first external connection terminal and a second external connection terminal;
    a flexible flat base body in which the signal transmission line is defined by a conductor pattern;
    a band-elimination filter that is connected between the first external connection terminal and the second external connection terminal by the signal transmission line and includes an inductor and a capacitor provided in or on the flexible flat base body; and
    a series resonance inductor; wherein
    the flexible flat base body includes a multilayer structure including a stack of a plurality of base layers;
    the inductor includes a line conductor pattern on at least one layer of the plurality of base layers;
    the inductor and the capacitor are connected in parallel by the conductor pattern; and the series resonance inductor includes a line conductor pattern on the plurality of base layers and is connected in series to the capacitor.

4. A signal transmission cable with diplexer functionality, comprising:
the signal transmission cable with band-elimination filter functionality according to claim 3; and
a bandpass filter including another conductor pattern provided in the flexible flat base body.

5. A communication device module comprising:
the signal transmission cable with diplexer functionality according to claim 4; and
an antenna board and a front end board that are connected by the signal transmission cable with diplexer functionality.

6. The signal transmission cable with band-elimination filter functionality according to claim 3, wherein
the line conductor pattern of the inductor includes a first line conductor pattern;
the line conductor pattern of the series resonance inductor includes a second line conductor pattern;
on each base layer of the plurality of base layers, the first line conductor pattern and the second line conductor pattern are provided;
the first line conductor patterns on respective base layers of the plurality of base layers are connected by a first interlayer-connector conductor;
the second line conductor patterns on respective base layers of the plurality of base layers are connected by a second interlayer-connector conductor; and
each of the second line conductor patterns is divided into a first portion connecting to the first external connection terminal and a second portion connecting to the second external connection terminal, and the first portion of one of the second line conductor patterns on a first base layer of the plurality of base layers is arranged opposite to the second portion of another one of the second line conductor patterns on a second base layer of the plurality of base layers over the first base layer.

7. The signal transmission cable with band-elimination filter functionality according to claim 6, wherein
the first line conductor patterns and the second line conductor patterns are provided on three or more base layers of the plurality of base layers; and
a plurality of opposing portions of the first portion and the second portion are provided.

8. The signal transmission cable with band-elimination filter functionality according to claim 3, wherein
the line conductor pattern of the inductor includes first line conductor patterns;
the line conductor pattern of the series resonance inductor includes second line conductor patterns;
the inductor includes a first spiral conductor pattern including the first line conductor patterns and a first interlayer-connector conductor connecting the first line conductor patterns, each of the first line conductor patterns being provided in a respective layer of the plurality of base layers and including a loop-shaped portion that is partially cut off; and
the series resonance inductor includes a second spiral conductor pattern including the second line conductor patterns and a second interlayer-connector conductor connecting the second line conductor patterns, each of the second line conductor patterns being provided on a respective layer of the plurality of base layers that is different from the respective layers on which the inductor is provided and including a loop-shaped portion that is partially cut off.

9. The signal transmission cable with band-elimination filter functionality according to claim 8, wherein a winding direction of the first spiral conductor pattern is opposite to a winding direction of the second spiral conductor pattern.

10. A communication device module comprising:
the signal transmission cable with band-elimination filter functionality according to claim 3;
an antenna board connected to the first external connection terminal; and
a front end board connected to the second external connection terminal.

11. The signal transmission cable with band-elimination filter functionality according to claim 3, wherein the capacitor includes flat conductor patterns located on the plurality of base layers and opposing to each other in a stacking direction of the multilayer structure.

12. The signal transmission cable with band-elimination filter functionality according to claim 3, wherein the flexible flat base body includes liquid crystal polymer.

13. The signal transmission cable with band-elimination filter functionality according to claim 3, wherein the first external connection terminal and the second external connection terminal each include a connector member that establishes an electrical connection with an external circuit by connecting each other mechanically.

14. A signal transmission cable with band-elimination filter functionality, comprising:
a signal transmission line that connects a first external connection terminal and a second external connection terminal;
a flexible flat base body in which the signal transmission line is defined by a conductor pattern; and
a band-elimination filter that is connected between the first external connection terminal and the second external connection terminal by the signal transmission line and includes an inductor and a capacitor provided in or on the flexible flat base body; wherein
the flexible flat base body includes a multilayer structure including a stack of a plurality of base layers;
the inductor includes a line conductor pattern on at least one layer of the plurality of base layers;
the inductor and the capacitor are connected in parallel by the conductor pattern;
the capacitor is a surface mount element; and
the surface mount element is arranged at a location where the signal transmission line is separated in such a way that the surface mount element is connected in series between separated signal transmission lines.

15. The signal transmission cable with band-elimination filter functionality according to claim 14, wherein the capacitor includes flat conductor patterns located on the plurality of base layers and opposing to each other in a stacking direction of the multilayer structure.

16. A communication device module comprising:
the signal transmission cable with band-elimination filter functionality according to claim 14;
an antenna board connected to the first external connection terminal; and
a front end board connected to the second external connection terminal.

17. The signal transmission cable with band-elimination filter functionality according to claim 14, wherein the flexible flat base body includes liquid crystal polymer.

18. The signal transmission cable with band-elimination filter functionality according to claim 14, wherein the first external connection terminal and the second external connection terminal each include a connector member that establishes an electrical connection with an external circuit by connecting each other mechanically.

19. A signal transmission cable with diplexer functionality, comprising:
- the signal transmission cable with band-elimination filter functionality according to claim 14; and
- a bandpass filter including another conductor pattern provided in the flexible flat base body.

20. A communication device module comprising:
- the signal transmission cable with diplexer functionality according to claim 19; and
- an antenna board and a front end board that are connected by the signal transmission cable with diplexer functionality.

* * * * *